(12) United States Patent
Yang et al.

(10) Patent No.: US 8,090,046 B2
(45) Date of Patent: Jan. 3, 2012

(54) INTERACTIVE COMPRESSION WITH MULTIPLE UNITS OF COMPRESSION STATE INFORMATION

(75) Inventors: En-Hui Yang, Waterloo (CA); Ajit Singh, Waterloo (CA); Salmaan Ahmed, Waterloo (CA); David P. Sze, Waterloo (CA)

(73) Assignee: Research In Motion Limited, Waterloo, Ontario (CA)

( * ) Notice: Subject to any disclaimer, the term of this patent is extended or adjusted under 35 U.S.C. 154(b) by 806 days.

(21) Appl. No.: 12/131,407

(22) Filed: Jun. 2, 2008

(65) Prior Publication Data

US 2008/0298459 A1 Dec. 4, 2008

Related U.S. Application Data

(60) Provisional application No. 60/941,613, filed on Jun. 1, 2007.

(51) Int. Cl.
*H04L 27/00* (2006.01)
(52) U.S. Cl. ..................................... 375/295
(58) Field of Classification Search ............ 341/51, 341/65, 67; 709/203, 247, 219; 375/240; 707/999.101
See application file for complete search history.

(56) References Cited

U.S. PATENT DOCUMENTS

| | | | |
|---|---|---|---|
| 5,045,852 A * | 9/1991 | Mitchell et al. | 341/51 |
| 5,953,503 A * | 9/1999 | Mitzenmacher et al. | 709/203 |
| 6,032,148 A | 2/2000 | Wilkes | |
| 6,195,024 B1 | 2/2001 | Fallon | |
| 6,785,667 B2 | 8/2004 | Orbanes et al. | |
| 7,013,304 B1 * | 3/2006 | Schuetze et al. | 1/1 |
| 2002/0056010 A1 * | 5/2002 | Lincoln et al. | 709/247 |
| 2004/0008650 A1 | 1/2004 | Le et al. | |
| 2004/0264568 A1 | 12/2004 | Florencio | |
| 2005/0027731 A1 * | 2/2005 | Revel | 707/101 |

FOREIGN PATENT DOCUMENTS

WO 2001/061543 8/2001

OTHER PUBLICATIONS

European Patent Application No. 08757182.4, European Search Report dated Aug. 18, 2010.
Written Opinion and International Search Report, PCT/CA2008/001046 dated Sep. 16, 2008.

* cited by examiner

*Primary Examiner* — David C. Payne
*Assistant Examiner* — Wednel Cadeau
(74) *Attorney, Agent, or Firm* — Anne Kinsman; Borden Ladner Gervais LLP

(57) ABSTRACT

There is provided a method of interactive compression using multiple compression state information entries. The method comprises receiving a request for data from a communicating party; retrieving the data; identifying, for use in compressing the data, at least two compression state information entries shared between the parties to the communication; compressing the data with each of the at least two compression state information entries; determining, from the set of compression state information entries, a preferred compression state information entry that provides a greatest compression ratio; and transmitting the data, compressed in accordance with the preferred compression state information entry to the communicating party.

22 Claims, 12 Drawing Sheets

INTERACTIVE COMPRESSION WITH MULTIPLE UNITS OF COMPRESSION STATE INFORMATION

CROSS-REFERENCE TO RELATED APPLICATIONS

This application claims the benefit of U.S. Provisional Application No. 60/941,613, filed Jun. 1, 2007, the contents of which incorporated herein in their entirety.

FIELD OF THE INVENTION

The present invention relates generally to interactive compression. More particularly, the present invention relates to interactive compression with multiple units of compression state information.

BACKGROUND OF THE INVENTION

In the field of data communication, data is typically compressed so that the amount of information being transmitted is reduced. Such data compression enables less traffic and therefore faster transmission. Compression also reduces storage requirements, which is especially important in communication to portable or mobile communication devices with limited storage capacity. In conventional communication between a server and a mobile communication device, requested data, such as message data, a website, or a digital file, is encoded, or compressed, by the server, and then transmitted. A decoder at the mobile communication device decodes the compressed data, and processes it appropriately, such as displaying it to the user.

Side information, defining parameters to be used in the compression and decompression of transmitted data, can improve compression performance. The choice of parameters and, therefore, the side information that defines those parameters, influences the compression ratio achieved by the compression. Significantly improved compression can be achieved in systems, known as interactive compression systems, that maintain shared and coherent caches of side information. With the implementation of grammar-based compression technologies, such as Yang-Kieffer (YK) universal data compression, the compression parameters, including the grammar rules and frequency counts, are updated as the compression algorithm evolves the grammar associated with the data being compressed. Related data may share some common portion of the grammar. Thus, knowledge of previously communicated data and the data currently being requested could be used to improve compression performance, and to provide interactive compression. However, side information has not previously included such knowledge, nor has a method for maintaining and sharing a coherent cache of such knowledge previously been proposed.

BRIEF DESCRIPTION OF THE DRAWINGS

Embodiments of the present invention will now be described, by way of example only, with reference to the attached Figures, wherein.

DETAILED DESCRIPTION

Figure 1:
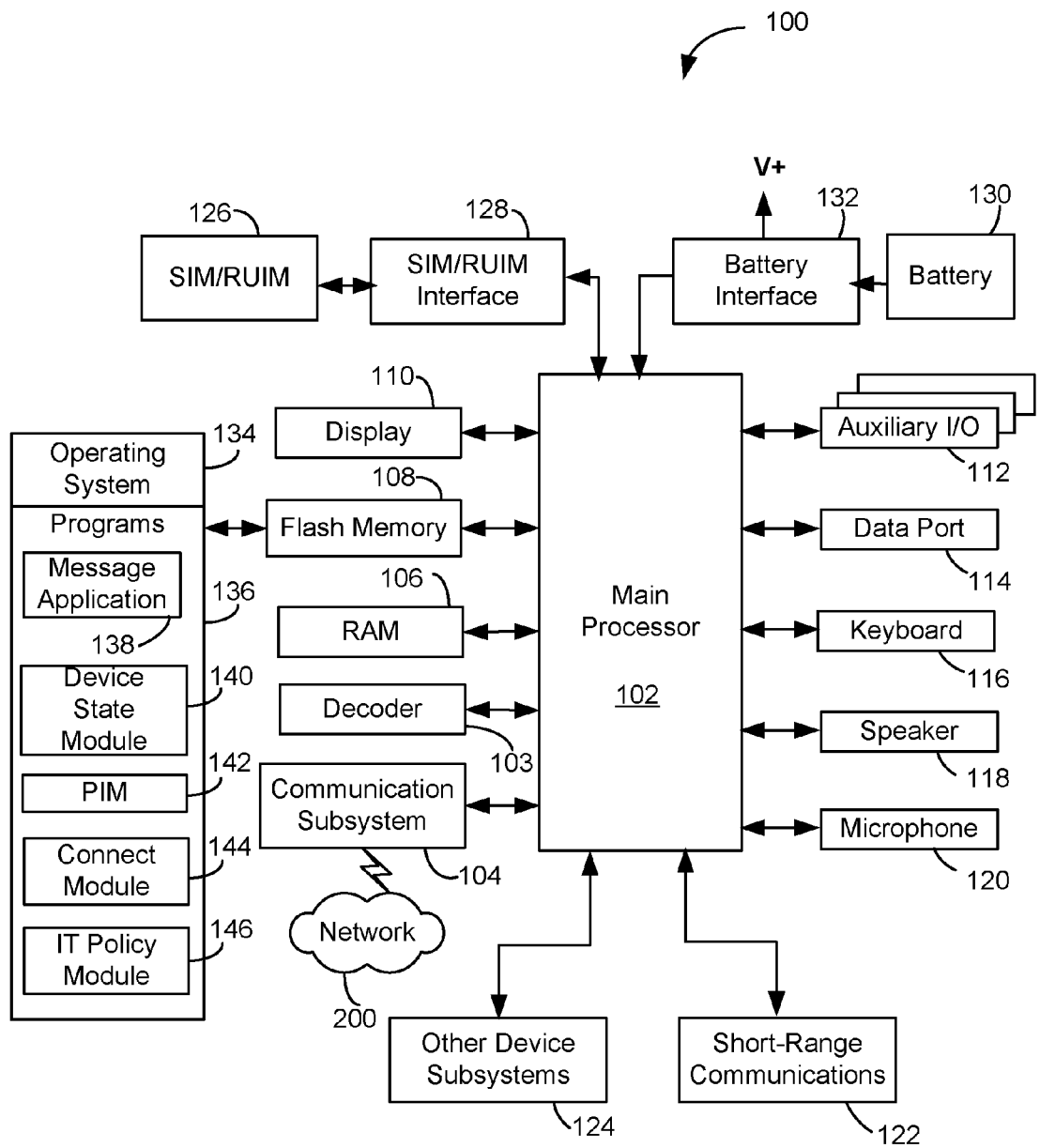
FIG. 1 is a block diagram of an exemplary embodiment of a mobile device.

Generally, described is a method and system for performing interactive compression between communicating parties, such as a server and a mobile communication device. In an embodiment, the interactive data compression is performed using a lossless data compression, such as that described in U.S. Pat. No. 6,801,141 to Yang et al., which is hereby incorporated by reference. This type of data compression, using grammar transforms, or rules, is also known as Yang-Kieffer (YK) data compression. In YK data compression, data is compressed into an irreducible context-dependent grammar form from which the original data may be recovered. The grammar form of previously compressed data can be used in compression of related data, particularly when dealing with data having similar properties and/or content. This grammar form can be used for subsequent compressions by storing parameters, such as the actual grammar rules and frequency counts, as compression state information, and can result in much enhanced compression, particularly in terms of increased speed of compression and reduced use of processing resources.

It will be appreciated that for simplicity and clarity of illustration, where considered appropriate, reference numerals may be repeated among the figures to indicate corresponding or analogous elements. In addition, numerous specific details are set forth in order to provide a thorough understanding of the embodiments described herein. However, it will be understood by those of ordinary skill in the art that the embodiments described herein may be practiced without these specific details. In other instances, well-known methods, procedures and components have not been described in detail so as not to obscure the embodiments described herein. Also, the description is not to be considered as limiting the scope of the embodiments described herein.

The embodiments described herein generally relate to a mobile wireless communication device, hereafter referred to as a mobile device. Examples of applicable communication devices include pagers, cellular phones, cellular smartphones, wireless organizers, personal digital assistants, computers, laptops, handheld wireless communication devices, wirelessly enabled notebook computers and the like.

The mobile device is a two-way communication device with advanced data communication capabilities including the capability to communicate with other mobile devices or computer systems through a network of transceiver stations. The mobile device may also have the capability to allow voice communication. Depending on the functionality provided by the mobile device, it may be referred to as a data messaging device, a two-way pager, a cellular telephone with data messaging capabilities, a wireless Internet appliance, or a data communication device (with or without telephony capabilities). To aid the reader in understanding the structure of the mobile device and how it communicates with other devices and host systems, reference will now be made to FIGS. 1 through 4.

Referring first to FIG. 1, shown therein is a block diagram of an exemplary embodiment of a mobile device 100. The mobile device 100 includes a number of components such as a main processor 102 that controls the overall operation of the mobile device 100. Communication functions, including data and voice communications, are performed through a communication subsystem 104. Data received by the mobile device 100 can be decompressed and decrypted by decoder 103, operating according to any suitable decompression techniques (e.g. YK decompression, and other known techniques) and encryption techniques (e.g. using an encryption techniques such as Data Encryption Standard (DES), Triple DES, or Advanced Encryption Standard (AES)). The communication subsystem 104 receives messages from and sends messages to a wireless network 200. In this exemplary embodiment of the mobile device 100, the communication subsystem 104 is configured in accordance with the Global System for Mobile Communication (GSM) and General Packet Radio Services (GPRS) standards. The GSM/GPRS wireless network is used worldwide and it is expected that these standards will be superseded eventually by Enhanced Data GSM Environment (EDGE) and Universal Mobile Telecommunications Service (UMTS). New standards are still being defined, but it is believed that they will have similarities to the network behavior described herein, and it will also be understood by persons skilled in the art that the embodiments described herein are intended to use any other suitable standards that are developed in the future. The wireless link connecting the communication subsystem 104 with the wireless network 200 represents one or more different Radio Frequency (RF) channels, operating according to defined protocols specified for GSM/GPRS communications. With newer network protocols, these channels are capable of supporting both circuit switched voice communications and packet switched data communications.

Although the wireless network 200 associated with mobile device 100 is a GSM/GPRS wireless network in one exemplary implementation, other wireless networks may also be associated with the mobile device 100 in variant implementations. The different types of wireless networks that may be employed include, for example, data-centric wireless networks, voice-centric wireless networks, and dual-mode networks that can support both voice and data communications over the same physical base stations. Combined dual-mode networks include, but are not limited to, Code Division Multiple Access (CDMA) or CDMA2000 networks, GSM/GPRS networks (as mentioned above), and future third-generation (3G) networks like EDGE and UMTS. Some other examples of data-centric networks include WiFi 802.11, Mobitex™ and DataTAC™ network communication systems. Examples of other voice-centric data networks include Personal Communication Systems (PCS) networks like GSM and Time Division Multiple Access (TDMA) systems. The main processor 102 also interacts with additional subsystems such as a Random Access Memory (RAM) 106, a flash memory 108, a display 110, an auxiliary input/output (I/O) subsystem 112, a data port 114, a keyboard 116, a speaker 118, a microphone 120, short-range communications 122 and other device subsystems 124.

Some of the subsystems of the mobile device 100 perform communication-related functions, whereas other subsystems may provide "resident" or on-device functions. By way of example, the display 110 and the keyboard 116 may be used for both communication-related functions, such as entering a text message for transmission over the network 200, and device-resident functions such as a calculator or task list.

The mobile device 100 can send and receive communication signals over the wireless network 200 after required network registration or activation procedures have been completed. Network access is associated with a subscriber or user of the mobile device 100. To identify a subscriber, the mobile device 100 requires a SIM/RUIM card 126 (i.e. Subscriber Identity Module or a Removable User Identity Module) to be inserted into a SIM/RUIM interface 128 in order to communicate with a network. The SIM card or RUIM 126 is one type of a conventional "smart card" that can be used to identify a subscriber of the mobile device 100 and to personalize the mobile device 100, among other things. Without the SIM card 126, the mobile device 100 is not fully operational for communication with the wireless network 200. By inserting the SIM card/RUIM 126 into the SIM/RUIM interface 128, a subscriber can access all subscribed services. Services may include: web browsing and messaging such as e-mail, voice mail, Short Message Service (SMS), and Multimedia Messaging Services (MMS). More advanced services may include: point of sale, field service and sales force automation. The SIM card/RUIM 126 includes a processor and memory for storing information. Once the SIM card/RUIM 126 is inserted into the SIM/RUIM interface 128, it is coupled to the main processor 102. In order to identify the subscriber, the SIM card/RUIM 126 can include some user parameters such as an International Mobile Subscriber Identity (IMSI). An advantage of using the SIM card/RUIM 126 is that a subscriber is not necessarily bound by any single physical mobile device. The SIM card/RUIM 126 may store additional subscriber information for a mobile device as well, including datebook (or calendar) information and recent call information. Alternatively, user identification information can also be programmed into the flash memory 108.

The mobile device 100 is a battery-powered device and includes a battery interface 132 for receiving one or more rechargeable batteries 130. In at least some embodiments, the battery 130 can be a smart battery with an embedded microprocessor. The battery interface 132 is coupled to a regulator (not shown), which assists the battery 130 in providing power V+ to the mobile device 100. Although current technology makes use of a battery, future technologies such as micro fuel cells may provide the power to the mobile device 100.

The mobile device 100 also includes an operating system 134 and software components 136 to 146 which are described in more detail below. The operating system 134 and the software components 136 to 146 that are executed by the main processor 102 are typically stored in a persistent store such as the flash memory 108, which may alternatively be a read-only memory (ROM) or similar storage element (not shown). Those skilled in the art will appreciate that portions of the operating system 134 and the software components 136 to 146, such as specific device applications, or parts thereof, may be temporarily loaded into a volatile store such as the RAM 106. Other software components can also be included, as is well known to those skilled in the art.

The subset of software applications 136 that control basic device operations, including data and voice communication applications, will normally be installed on the mobile device 100 during its manufacture. Other software applications include a message application 138 that can be any suitable software program that allows a user of the mobile device 100 to send and receive electronic messages. Various alternatives exist for the message application 138 as is well known to those skilled in the art. Messages that have been sent or received by the user are typically stored in the flash memory 108 of the mobile device 100 or some other suitable storage element in the mobile device 100. In at least some embodiments, some of the sent and received messages may be stored remotely from the device 100 such as in a data store of an associated host system that the mobile device 100 communicates with.

The software applications can further include a device state module 140, a Personal Information Manager (PIM) 142, and other suitable modules (not shown). The device state module 140 provides persistence, i.e. the device state module 140 ensures that important device data is stored in persistent memory, such as the flash memory 108, so that the data is not lost when the mobile device 100 is turned off or loses power.

The PIM 142 includes functionality for organizing and managing data items of interest to the user, such as, but not limited to, e-mail, contacts, calendar events, voice mails, appointments, and task items. A PIM application has the ability to send and receive data items via the wireless network 200. PIM data items may be seamlessly integrated, synchronized, and updated via the wireless network 200 with the mobile device subscriber's corresponding data items stored and/or associated with a host computer system. This functionality creates a mirrored host computer on the mobile device 100 with respect to such items. This can be particularly advantageous when the host computer system is the mobile device subscriber's office computer system.

The mobile device 100 also includes a connect module 144, and an information technology (IT) policy module 146. The connect module 144 implements the communication protocols that are required for the mobile device 100 to communicate with the wireless infrastructure and any host system, such as an enterprise system, that the mobile device 100 is authorized to interface with. Examples of a wireless infrastructure and an enterprise system are given in FIGS. 3 and 4, which are described in more detail below.

The connect module 144 includes a set of APIs that can be integrated with the mobile device 100 to allow the mobile device 100 to use any number of services associated with the enterprise system. The connect module 144 allows the mobile device 100 to establish an end-to-end secure, authenticated communication pipe with the host system. A subset of applications for which access is provided by the connect module 144 can be used to pass IT policy commands from the host system to the mobile device 100. This can be done in a wireless or wired manner. These instructions can then be passed to the IT policy module 146 to modify the configuration of the device 100. Alternatively, in some cases, the IT policy update can also be done over a wired connection.

Other types of software applications can also be installed on the mobile device 100. These software applications can be third party applications, which are added after the manufacture of the mobile device 100. Examples of third party applications include games, calculators, utilities, etc.

The additional applications can be loaded onto the mobile device 100 through at least one of the wireless network 200, the auxiliary I/O subsystem 112, the data port 114, the short-range communications subsystem 122, or any other suitable device subsystem 124. This flexibility in application installation increases the functionality of the mobile device 100 and may provide enhanced on-device functions, communication-related functions, or both. For example, secure communication applications may enable electronic commerce functions and other such financial transactions to be performed using the mobile device 100.

The data port 114 enables a subscriber to set preferences through an external device or software application and extends the capabilities of the mobile device 100 by providing for information or software downloads to the mobile device 100 other than through a wireless communication network. The alternate download path may, for example, be used to load an encryption key onto the mobile device 100 through a direct and thus reliable and trusted connection to provide secure device communication.

The data port 114 can be any suitable port that enables data communication between the mobile device 100 and another computing device. The data port 114 can be a serial or a parallel port. In some instances, the data port 114 can be a USB port that includes data lines for data transfer and a supply line that can provide a charging current to charge the battery 130 of the mobile device 100.

The short-range communications subsystem 122 provides for communication between the mobile device 100 and different systems or devices, without the use of the wireless network 200. For example, the subsystem 122 may include an infrared device and associated circuits and components for short-range communication. Examples of short-range communication standards include standards developed by the Infrared Data Association (IrDA), Bluetooth, and the 802.11 family of standards developed by IEEE.

In use, a received signal such as a text message, an e-mail message, or web page download will be processed by the communication subsystem 104 and input to the main processor 102. The main processor 102 will then process the received signal for output to the display 110 or alternatively to the auxiliary I/O subsystem 112. A subscriber may also compose data items, such as e-mail messages, for example, using the keyboard 116 in conjunction with the display 110 and possibly the auxiliary I/O subsystem 112. The auxiliary subsystem 112 may include devices such as: a touch screen, mouse, track ball, infrared fingerprint detector, or a roller wheel with dynamic button pressing capability. The keyboard 116 is preferably an alphanumeric keyboard and/or telephone-type keypad. However, other types of keyboards may also be used. A composed item may be transmitted over the wireless network 200 through the communication subsystem 104.

For voice communications, the overall operation of the mobile device 100 is substantially similar, except that the received signals are output to the speaker 118, and signals for transmission are generated by the microphone 120. Alternative voice or audio I/O subsystems, such as a voice message recording subsystem, can also be implemented on the mobile device 100. Although voice or audio signal output is accomplished primarily through the speaker 118, the display 110 can also be used to provide additional information such as the identity of a calling party, duration of a voice call, or other voice call related information.

Figure 2:
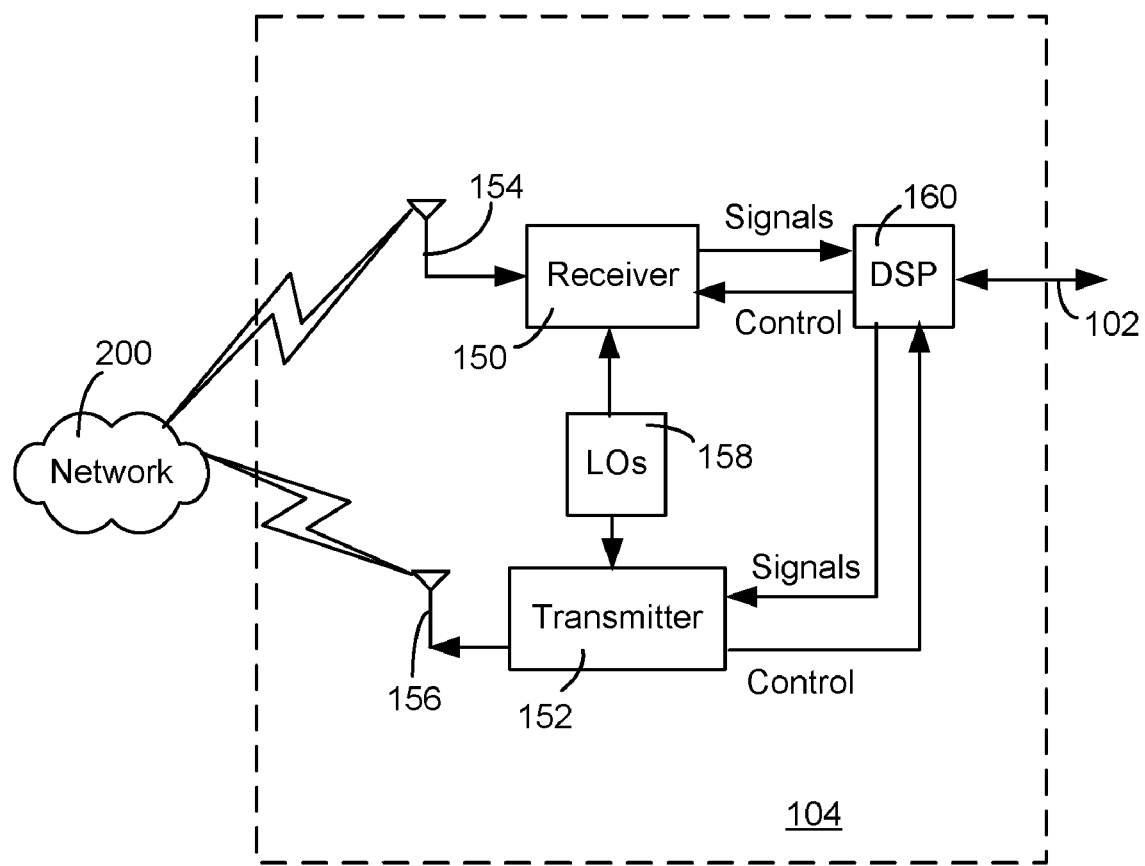
FIG. 2 is a block diagram of an exemplary embodiment of a communication subsystem component of the mobile device of FIG. 1.

Referring now to FIG. 2, an exemplary block diagram of the communication subsystem component 104 is shown. The communication subsystem 104 includes a receiver 150, a transmitter 152, as well as associated components such as one or more embedded or internal antenna elements 154 and 156, Local Oscillators (LOs) 158, and a processing module such as a Digital Signal Processor (DSP) 160. The particular design of the communication subsystem 104 is dependent upon the communication network 200 with which the mobile device 100 is intended to operate. Thus, it should be understood that the design illustrated in FIG. 2 serves only as one example.

Signals received by the antenna 154 through the wireless network 200 are input to the receiver 150, which may perform such common receiver functions as signal amplification, frequency down conversion, filtering, channel selection, and analog-to-digital (A/D) conversion. A/D conversion of a received signal allows more complex communication functions such as demodulation and decoding to be performed in the DSP 160. In a similar manner, signals to be transmitted are processed, including modulation and encoding, by the DSP 160. These DSP-processed signals are input to the transmitter 152 for digital-to-analog (D/A) conversion, frequency up conversion, filtering, amplification and transmission over the wireless network 200 via the antenna 156. The DSP 160 not only processes communication signals, but also provides for receiver and transmitter control. For example, the gains applied to communication signals in the receiver 150 and the transmitter 152 may be adaptively controlled through automatic gain control algorithms implemented in the DSP 160.

The wireless link between the mobile device 100 and the wireless network 200 can contain one or more different channels, typically different RF channels, and associated protocols used between the mobile device 100 and the wireless network 200. An RF channel is a limited resource that should be conserved, typically due to limits in overall bandwidth and limited battery power of the mobile device 100.

When the mobile device 100 is fully operational, the transmitter 152 is typically keyed or turned on only when it is transmitting to the wireless network 200 and is otherwise turned off to conserve resources. Similarly, the receiver 150 is periodically turned off to conserve power until it is needed to receive signals or information (if at all) during designated time periods.

Figure 3:
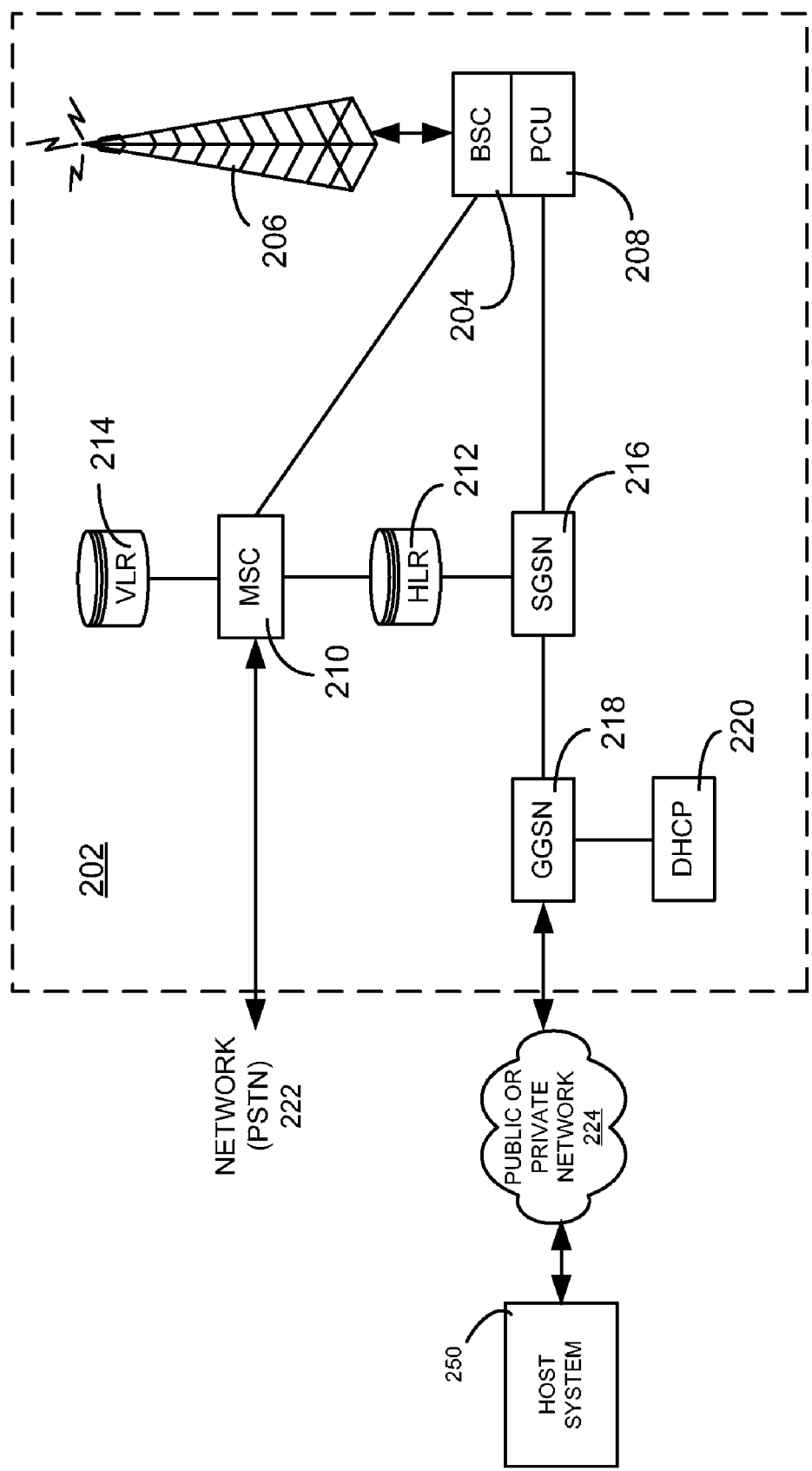
FIG. 3 is an exemplary block diagram of a node of a wireless network.

Referring now to FIG. 3, a block diagram of an exemplary implementation of a node 202 of the wireless network 200 is shown. In practice, the wireless network 200 comprises one or more nodes 202. In conjunction with the connect module 144, the mobile device 100 can communicate with the node 202 within the wireless network 200. In the exemplary implementation of FIG. 3, the node 202 is configured in accordance with General Packet Radio Service (GPRS) and Global Systems for Mobile (GSM) technologies. The node 202 includes a base station controller (BSC) 204 with an associated tower station 206, a Packet Control Unit (PCU) 208 added for GPRS support in GSM, a Mobile Switching Center (MSC) 210, a Home Location Register (HLR) 212, a Visitor Location Registry (VLR) 214, a Serving GPRS Support Node (SGSN) 216, a Gateway GPRS Support Node (GGSN) 218, and a Dynamic Host Configuration Protocol (DHCP) 220. This list of components is not meant to be an exhaustive list of the components of every node 202 within a GSM/GPRS network, but rather a list of components that are commonly used in communications through the network 200.

In a GSM network, the MSC 210 is coupled to the BSC 204 and to a landline network, such as a Public Switched Telephone Network (PSTN) 222 to satisfy circuit switched requirements. The connection through the PCU 208, the SGSN 216 and the GGSN 218 to a public or private network (Internet) 224 (also referred to herein generally as a shared network infrastructure) represents the data path for GPRS capable mobile devices. In a GSM network extended with GPRS capabilities, the BSC 204 also contains the Packet Control Unit (PCU) 208 that connects to the SGSN 216 to control segmentation, radio channel allocation and to satisfy packet switched requirements. To track the location of the mobile device 100 and availability for both circuit switched and packet switched management, the HLR 212 is shared between the MSC 210 and the SGSN 216. Access to the VLR 214 is controlled by the MSC 210.

The station 206 is a fixed transceiver station and together with the BSC 204 form fixed transceiver equipment. The fixed transceiver equipment provides wireless network coverage for a particular coverage area commonly referred to as a "cell". The fixed transceiver equipment transmits communication signals to and receives communication signals from mobile devices within its cell via the station 206. The fixed transceiver equipment normally performs such functions as modulation and possibly encoding and/or encryption of signals to be transmitted to the mobile device 100 in accordance with particular, usually predetermined, communication protocols and parameters, under control of its controller. The fixed transceiver equipment similarly demodulates and possibly decodes and decrypts, if necessary, any communication signals received from the mobile device 100 within its cell. Communication protocols and parameters may vary between different nodes. For example, one node may employ a different modulation scheme and operate at different frequencies than other nodes.

For all mobile devices 100 registered with a specific network, permanent configuration data such as a user profile is stored in the HLR 212. The HLR 212 also contains location information for each registered mobile device and can be queried to determine the current location of a mobile device. The MSC 210 is responsible for a group of location areas and stores the data of the mobile devices currently in its area of responsibility in the VLR 214. Further, the VLR 214 also contains information on mobile devices that are visiting other networks. The information in the VLR 214 includes part of the permanent mobile device data transmitted from the HLR 212 to the VLR 214 for faster access. By moving additional information from a remote HLR 212 node to the VLR 214, the amount of traffic between these nodes can be reduced so that voice and data services can be provided with faster response times and at the same time requiring less use of computing resources.

The SGSN 216 and the GGSN 218 are elements added for GPRS support; namely packet switched data support, within GSM. The SGSN 216 and the MSC 210 have similar responsibilities within the wireless network 200 by keeping track of the location of each mobile device 100. The SGSN 216 also performs security functions and access control for data traffic on the wireless network 200. The GGSN 218 provides internetworking connections with external packet switched networks and connects to one or more SGSN's 216 via an Internet Protocol (IP) backbone network operated within the network 200. During normal operations, a given mobile device 100 must perform a "GPRS Attach" to acquire an IP address and to access data services. This requirement is not present in circuit switched voice channels as Integrated Services Digital Network (ISDN) addresses are used for routing incoming and outgoing calls. Currently, all GPRS capable networks use private, dynamically assigned IP addresses, thus requiring the DHCP server 220 connected to the GGSN 218. There are many mechanisms for dynamic IP assignment, including using a combination of a Remote Authentication Dial-In User Service (RADIUS) server and a DHCP server. Once the GPRS Attach is complete, a logical connection is established from a mobile device 100, through the PCU 208, and the SGSN 216 to an Access Point Node (APN) within the GGSN 218. The APN represents a logical end of an IP tunnel that can either access direct Internet compatible services or private network connections. The APN also represents a security mechanism for the network 200, insofar as each mobile device 100 must be assigned to one or more APNs and mobile devices 100 cannot exchange data without first performing a GPRS Attach to an APN that it has been authorized to use. The APN may be considered to be similar to an Internet domain name such as "myconnection.wireless.com".

Once the GPRS Attach operation is complete, a tunnel is created and all traffic is exchanged within standard IP packets using any protocol that can be supported in IP packets. This includes tunneling methods such as IP over IP as in the case with some IPSecurity (IPsec) connections used with Virtual Private Networks (VPN). These tunnels are also referred to as Packet Data Protocol (PDP) Contexts and there are a limited number of these available in the network 200. To maximize use of the PDP Contexts, the network 200 will run an idle timer for each PDP Context to determine if there is a lack of activity. When a mobile device 100 is not using its PDP Context, the PDP Context can be de-allocated and the IP address returned to the IP address pool managed by the DHCP server 220.

Figure 4:
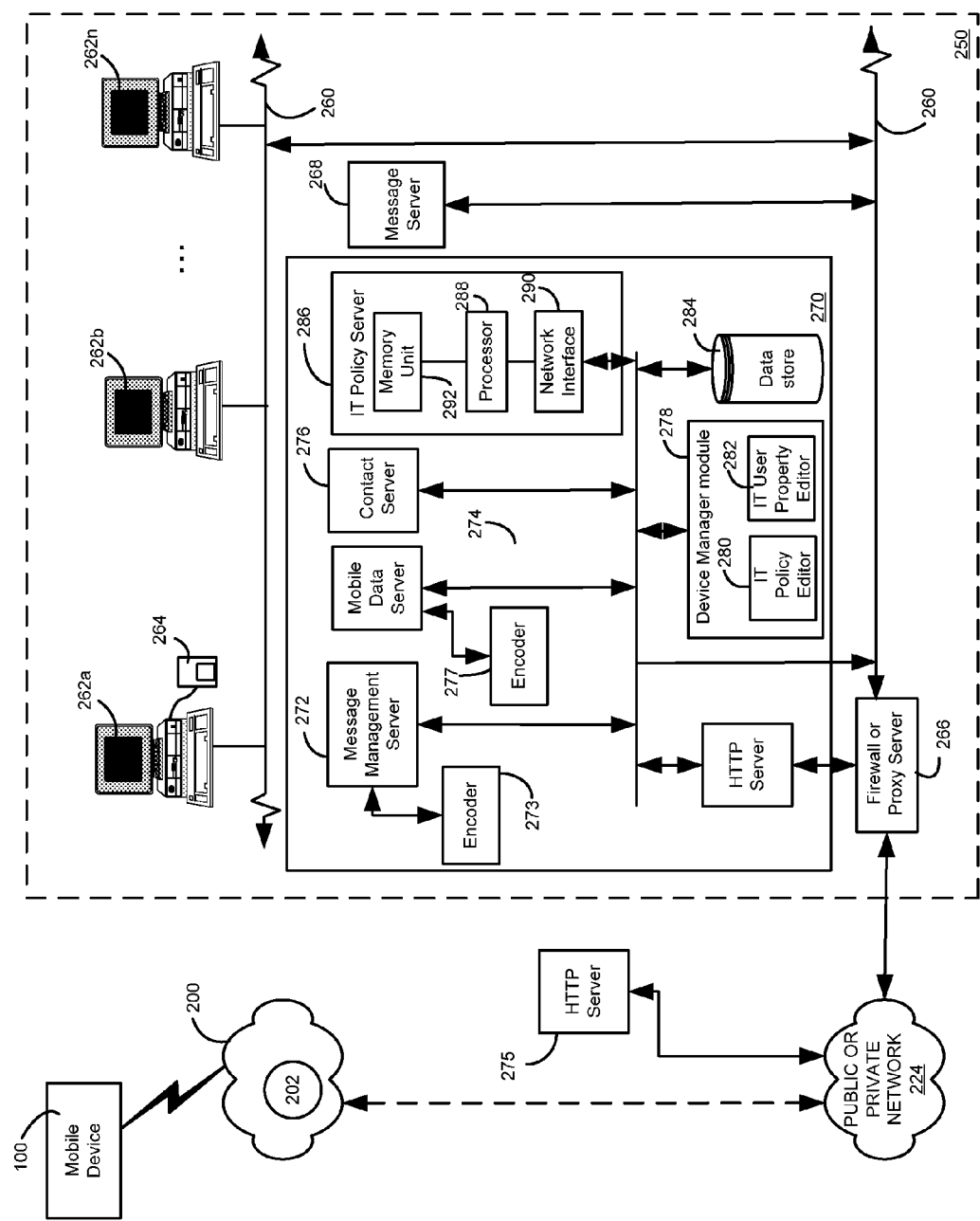
FIG. 4 is a block diagram illustrating components of a host system in one exemplary configuration for use with the wireless network of FIG. 3 and the mobile device of FIG. 1.

Referring now to FIG. 4, shown therein is a block diagram illustrating components of an exemplary configuration of a host system 250 that the mobile device 100 can communicate with in conjunction with the connect module 144. The host system 250 will typically be a corporate enterprise or other local area network (LAN), but may also be a home office computer or some other private system, for example, in variant implementations. In this example shown in FIG. 4, the host system 250 is depicted as a LAN of an organization to which a user of the mobile device 100 belongs. Typically, a plurality of mobile devices can communicate wirelessly with the host system 250 through one or more nodes 202 of the wireless network 200.

The host system 250 comprises a number of network components connected to each other by a network 260. For instance, a user's desktop computer 262a with an accompanying cradle 264 for the user's mobile device 100 is situated on a LAN connection. The cradle 264 for the mobile device 100 can be coupled to the computer 262a by a serial or a Universal Serial Bus (USB) connection, for example. Other user computers 262b-262n are also situated on the network 260, and each may or may not be equipped with an accompanying cradle 264. The cradle 264 facilitates the loading of information (e.g. PIM data, private symmetric encryption keys to facilitate secure communications) from the user computer 262a to the mobile device 100, and may be particularly useful for bulk information updates often performed in initializing the mobile device 100 for use. The information downloaded to the mobile device 100 may include certificates used in the exchange of messages.

It will be understood by persons skilled in the art that the user computers 262a-262n will typically also be connected to other peripheral devices, such as printers, etc. which are not explicitly shown in FIG. 4. Furthermore, only a subset of network components of the host system 250 are shown in FIG. 4 for ease of exposition, and it will be understood by persons skilled in the art that the host system 250 will comprise additional components that are not explicitly shown in FIG. 4 for this exemplary configuration. More generally, the host system 250 may represent a smaller part of a larger network (not shown) of the organization, and may comprise different components and/or be arranged in different topologies than that shown in the exemplary embodiment of FIG. 4.

To facilitate the operation of the mobile device 100 and the wireless communication of messages and message-related data between the mobile device 100 and components of the host system 250, a number of wireless communication support components 270 can be provided. In some implementations, the wireless communication support components 270 can include a message management server 272, a mobile data server (MDS) 274, a web server, such as Hypertext Transfer Protocol (HTTP) server 275, a contact server 276, and a device manager module 278. HTTP servers can also be located outside the enterprise system, as indicated by the HTTP server 275 attached to the network 224. The device manager module 278 includes an IT Policy editor 280 and an IT user property editor 282, as well as other software components for allowing an IT administrator to configure the mobile devices 100. In an alternative embodiment, there may be one editor that provides the functionality of both the IT policy editor 280 and the IT user property editor 282. The support components 270 also include a data store 284, and an IT policy server 286. The IT policy server 286 includes a processor 288, a network interface 290 and a memory unit 292. The processor 288 controls the operation of the IT policy server 286 and executes functions related to the standardized IT policy as described below. The network interface 290 allows the IT policy server 286 to communicate with the various components of the host system 250 and the mobile devices 100. The memory unit 292 can store functions used in implementing the IT policy as well as related data. Those skilled in the art know how to implement these various components. Other components may also be included as is well known to those skilled in the art. Further, in some implementations, the data store 284 can be part of any one of the servers.

In this exemplary embodiment, the mobile device 100 communicates with the host system 250 through node 202 of the wireless network 200 and a shared network infrastructure 224 such as a service provider network or the public Internet. Access to the host system 250 may be provided through one or more routers (not shown), and computing devices of the host system 250 may operate from behind a firewall or proxy server 266. The proxy server 266 provides a secure node and a wireless internet gateway for the host system 250. The proxy server 266 intelligently routes data to the correct destination server within the host system 250.

In some implementations, the host system 250 can include a wireless VPN router (not shown) to facilitate data exchange between the host system 250 and the mobile device 100. The wireless VPN router allows a VPN connection to be established directly through a specific wireless network to the mobile device 100. The wireless VPN router can be used with the Internet Protocol (IP) Version 6 (IPV6) and IP-based wireless networks. This protocol can provide enough IP addresses so that each mobile device has a dedicated IP address, making it possible to push information to a mobile device at any time. An advantage of using a wireless VPN router is that it can be an off-the-shelf VPN component, and does not require a separate wireless gateway and separate wireless infrastructure. A VPN connection can preferably be a Transmission Control Protocol (TCP)/IP or User Datagram Protocol (UDP)/IP connection for delivering the messages directly to the mobile device 100 in this alternative implementation.

Messages intended for a user of the mobile device 100 are initially received by a message server 268 of the host system 250. Such messages may originate from any number of sources. For instance, a message may have been sent by a sender from the computer 262b within the host system 250, from a different mobile device (not shown) connected to the wireless network 200 or a different wireless network, or from a different computing device, or other device capable of sending messages, via the shared network infrastructure 224, possibly through an application service provider (ASP) or Internet service provider (ISP), for example.

The message server 268 typically acts as the primary interface for the exchange of messages, particularly e-mail messages, within the organization and over the shared network infrastructure 224. Each user in the organization that has been set up to send and receive messages is typically associated with a user account managed by the message server 268. Some exemplary implementations of the message server 268 include a Microsoft Exchange™ server, a Lotus Domino™ server, a Novell Groupwise™ server, or another suitable mail server installed in a corporate environment. In some implementations, the host system 250 may comprise multiple message servers 268. The message server 268 may also be adapted to provide additional functions beyond message management, including the management of data associated with calendars and task lists, for example.

When messages are received by the message server 268, they are typically stored in a data store associated with the message server 268. In at least some embodiments, the data store may be a separate hardware unit, such as data store 284, that the message server 268 communicates with. Messages can be subsequently retrieved and delivered to users by accessing the message server 268. For instance, an e-mail client application operating on a user's computer 262a may request the e-mail messages associated with that user's account stored on the data store associated with the message server 268. These messages are then retrieved from the data store and stored locally on the computer 262a. The data store associated with the message server 268 can store copies of each message that is locally stored on the mobile device 100. Alternatively, the data store associated with the message server 268 can store all of the messages for the user of the mobile device 100 and only a smaller number of messages can be stored on the mobile device 100 to conserve memory. For instance, the most recent messages (i.e. those received in the past two to three months for example) can be stored on the mobile device 100.

When operating the mobile device 100, the user may wish to have e-mail messages retrieved for delivery to the mobile device 100. The message application 138 operating on the mobile device 100 may also request messages associated with the user's account from the message server 268. The message application 138 may be configured (either by the user or by an administrator, possibly in accordance with an organization's IT policy) to make this request at the direction of the user, at some pre-defined time interval, or upon the occurrence of some pre-defined event. In some implementations, the mobile device 100 is assigned its own e-mail address, and messages addressed specifically to the mobile device 100 are automatically redirected to the mobile device 100 as they are received by the message server 268.

The message management server 272 can be used to specifically provide support for the management of messages, such as e-mail messages, that are to be handled by mobile devices. Generally, while messages are still stored on the message server 268, the message management server 272 can be used to control when, if, and how messages are sent to the mobile device 100. The message management server 272 also facilitates the handling of messages composed on the mobile device 100, which are sent to the message server 268 for subsequent delivery.

For example, the message management server 272 may monitor the user's "mailbox" (e.g. the message store associated with the user's account on the message server 268) for new e-mail messages, and apply user-definable filters to new messages to determine if and how the messages are relayed to the user's mobile device 100. The message management server 272 may also, through an encoder 273, compress messages, using any suitable compression technology (e.g. YK compression, and other known techniques) and encrypt messages (e.g. using an encryption technique such as Data Encryption Standard (DES), Triple DES, or Advanced Encryption Standard (AES)), and push them to the mobile device 100 via the shared network infrastructure 224 and the wireless network 200. The message management server 272 may also receive messages composed on the mobile device 100 (e.g. encrypted using Triple DES), decrypt and decompress the composed messages, re-format the composed messages if desired so that they will appear to have originated from the user's computer 262a, and re-route the composed messages to the message server 268 for delivery.

Certain properties or restrictions associated with messages that are to be sent from and/or received by the mobile device 100 can be defined (e.g. by an administrator in accordance with IT policy) and enforced by the message management server 272. These may include whether the mobile device 100 may receive encrypted and/or signed messages, minimum encryption key sizes, whether outgoing messages must be encrypted and/or signed, and whether copies of all secure messages sent from the mobile device 100 are to be sent to a pre-defined copy address, for example.

The message management server 272 may also be adapted to provide other control functions, such as only pushing certain message information or pre-defined portions (e.g. "blocks") of a message stored on the message server 268 to the mobile device 100. For example, in some cases, when a message is initially retrieved by the mobile device 100 from the message server 268, the message management server 272 may push only the first part of a message to the mobile device 100, with the part being of a pre-defined size (e.g. 2 KB). The user can then request that more of the message be delivered in similar-sized blocks by the message management server 272 to the mobile device 100, possibly up to a maximum pre-defined message size. Accordingly, the message management server 272 facilitates better control over the type of data and the amount of data that is communicated to the mobile device 100, and can help to minimize potential waste of bandwidth or other resources.

The MDS 274 encompasses any other server that stores information that is relevant to the corporation. The mobile data server 274 may include, but is not limited to, databases, online data document repositories, customer relationship management (CRM) systems, or enterprise resource planning (ERP) applications. The MDS 274 can also connect to the Internet or other public network, through HTTP server 275 or other suitable web server such as an File Transfer Protocol (FTP) server, to retrieve HTTP webpages and other data. Requests for webpages are typically routed through MDS 274 and then to HTTP server 275, through suitable firewalls and other protective mechanisms. The web server then retrieves the webpage over the Internet, and returns it to MDS 274. As described above in relation to message management server 272, MDS 274 is typically provided, or associated, with an encoder 277 that permits retrieved data, such as retrieved webpages, to be compressed, using any suitable compression technology (e.g. YK compression, and other known techniques), and encrypted (e.g. using an encryption technique such as DES, Triple DES, or AES), and then pushed to the mobile device 100 via the shared network infrastructure 224 and the wireless network 200.

The contact server 276 can provide information for a list of contacts for the user in a similar fashion as the address book on the mobile device 100. Accordingly, for a given contact, the contact server 276 can include the name, phone number, work address and e-mail address of the contact, among other information. The contact server 276 can also provide a global address list that contains the contact information for all of the contacts associated with the host system 250.

It will be understood by persons skilled in the art that the message management server 272, the MDS 274, the HTTP server 275, the contact server 276, the device manager module 278, the data store 284 and the IT policy server 286 do not need to be implemented on separate physical servers within the host system 250. For example, some or all of the functions associated with the message management server 272 may be integrated with the message server 268, or some other server in the host system 250. Alternatively, the host system 250 may comprise multiple message management servers 272, particularly in variant implementations where a large number of mobile devices need to be supported.

The device manager module 278 provides an IT administrator with a graphical user interface with which the IT administrator interacts to configure various settings for the mobile devices 100. As mentioned, the IT administrator can use IT policy rules to define behaviors of certain applications on the mobile device 100 that are permitted such as phone, web browser or Instant Messenger use. The IT policy rules can also be used to set specific values for configuration settings that an organization requires on the mobile devices 100 such as auto signature text, WLAN/VoIP/VPN configuration, security requirements (e.g. encryption algorithms, password rules, etc.), specifying themes or applications that are allowed to run on the mobile device 100, and the like.

Figure 5:
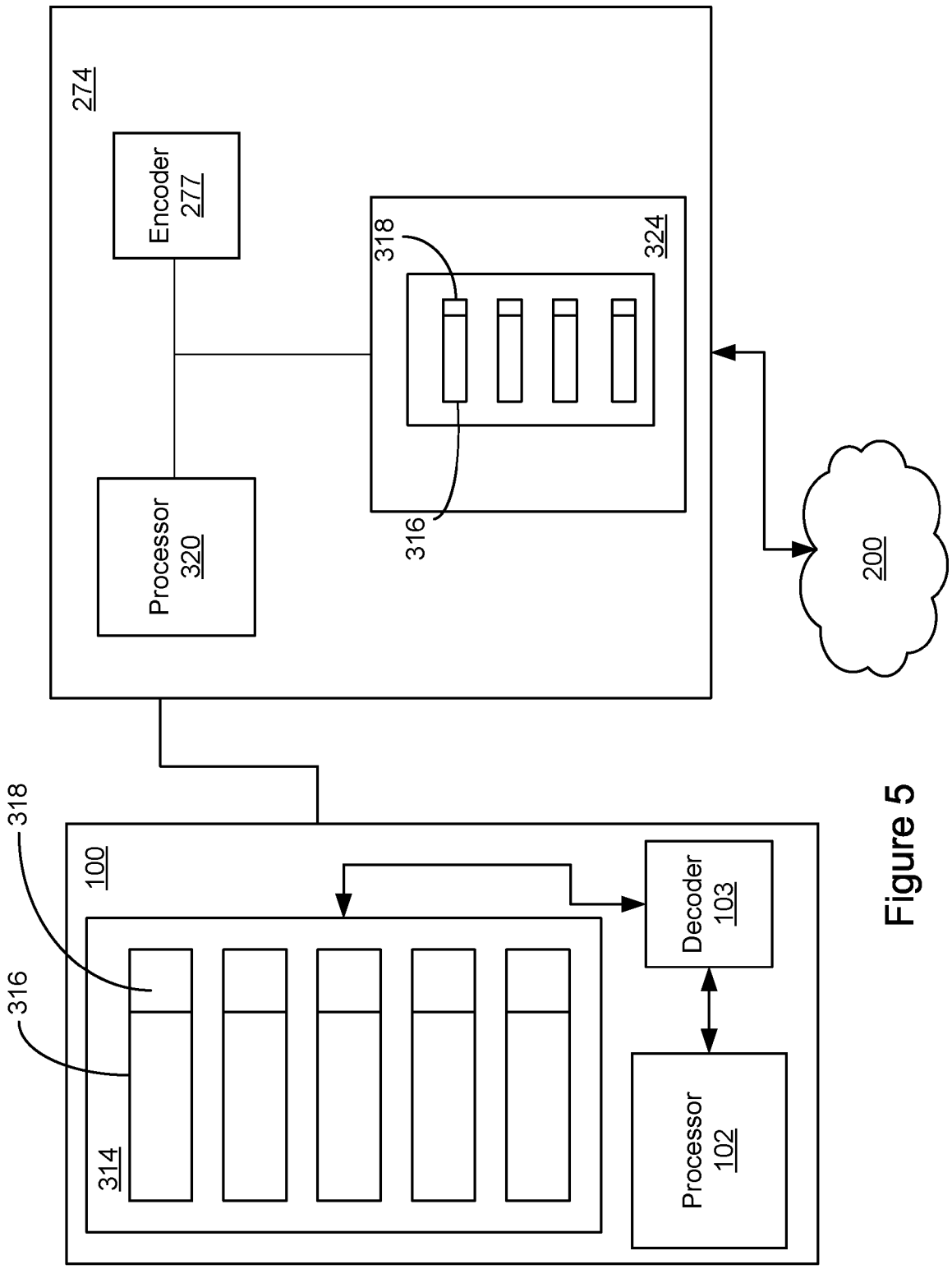
FIG. 5 is a schematic view of a mobile communication device and a server are shown.

Referring to FIG. 5, a schematic view of the mobile device 100 and a server, such as MDS 274, the message management server 272 or any other server involved in the transfer of information or data to and from the mobile device 100, is shown. The mobile device 100 and the server can be seen as communicating parties for a method of interactive compression.

The mobile device 100 includes a main processor 102, a decoder 103, and a device side information database 314, which can also be described as a cache, store, or repository. The device side information database 314 stores a plurality of units of side information 316. Side information is information which is used to describe parameters associated with data such as emails or web pages. This side information can include compression state information 318. The compression state information 318 includes parameters, such as grammar rules and/or frequency counts, of previously completed compressions. As previously noted, the compression state information from previously completed compressions can improve compression of subsequent data having similar properties and/or content. The server includes a processor 320, and has access to an encoder, such as encoder 277, and a server side information database 324. The encoder 277 and the server side information database 324 can be integral with the server, or separate therefrom. The server side information database 324 generally contains side information, including compression state information, associated with multiple mobile devices. The server is connected to the network 200 so that it may retrieve data from other servers connected to the network, such as HTTP server 275, as is described in more detail below.

The side information stored in the respective side information databases 314 and 324 can be organized, or represented, hierarchically, or otherwise mapped or structured for retrieval. The following discussion will describe the retrieval of side information, including compression state information, in a hierarchical trie structure. However, any representation of data in which side information is searchably mapped, or associated, with its respective originating data, and that can be searched or traversed to determine related nodes or to otherwise identify data related to a current compression, can be used. The structuring of the side information into a trie structure is a choice of implementation.

Interactive compression according to the present invention can be generally understood by reference to an exemplary HTTP webpage transmission to the mobile device 100. More specific examples, with reference to FIGS. 6-11 are provided below. The mobile device 100 identifies data to request, such as a webpage identified by a Uniform Resource Locator (URL). The device 100 then parses the URL to determine its constituent elements (e.g. media-type, domain name, path, and optionally query) that identify, or otherwise point to the location or path to, the requested data, and searches its device side information database 314 to identify at least one compression state information entry that is associated with the nearest related previously compressed data. The nearest related previously compressed data can be identified by comparison of the constituent elements of the requested data to the data representation stored in the device side information database 314. For example, at a minimum, the nearest related previously compressed data and currently requested data should have the same media-type, and should share a minimum number of common elements. While the media-type may not be known until a valid response is received, the device 100 can assume that the file extension (e.g. "exe", "txt", "html", "gif", etc) is a good indication of the media type of the response. The minimum number of common elements can be a certain number of constituent elements from the URL, such as the domain name and a specified number of path elements. If multiple compression state information entries are identified, rules can be used to preferentially select those that were most recently created. An identification of one, or more, of the identified compression state information entries is then appended to the HTTP request header and sent with the data request to the server. This identification can include one or more hashes designed to minimize the likelihood of multiple compression state information entries resolving to the same index. The server retrieves the requested data, and uses the compression state information identification to locate the corresponding compression state information entry. The compression parameters of the encoder 277 are then set according to the identified compression state information, and the requested data is encoded. If, for any reason, the server cannot use or locate the identified compression state information, the requested data can be encoded using an encoder-selected compression state information entry, or with no compression state information (i.e. from scratch). The compressed data is then sent to the device 100, with an identification of the state compression information, or the state compression information itself, used in the compression in its HTTP response header. The state compression information thus identified or transmitted can be used by the decoder 103 to decompress and display the requested data.

Figure 6:
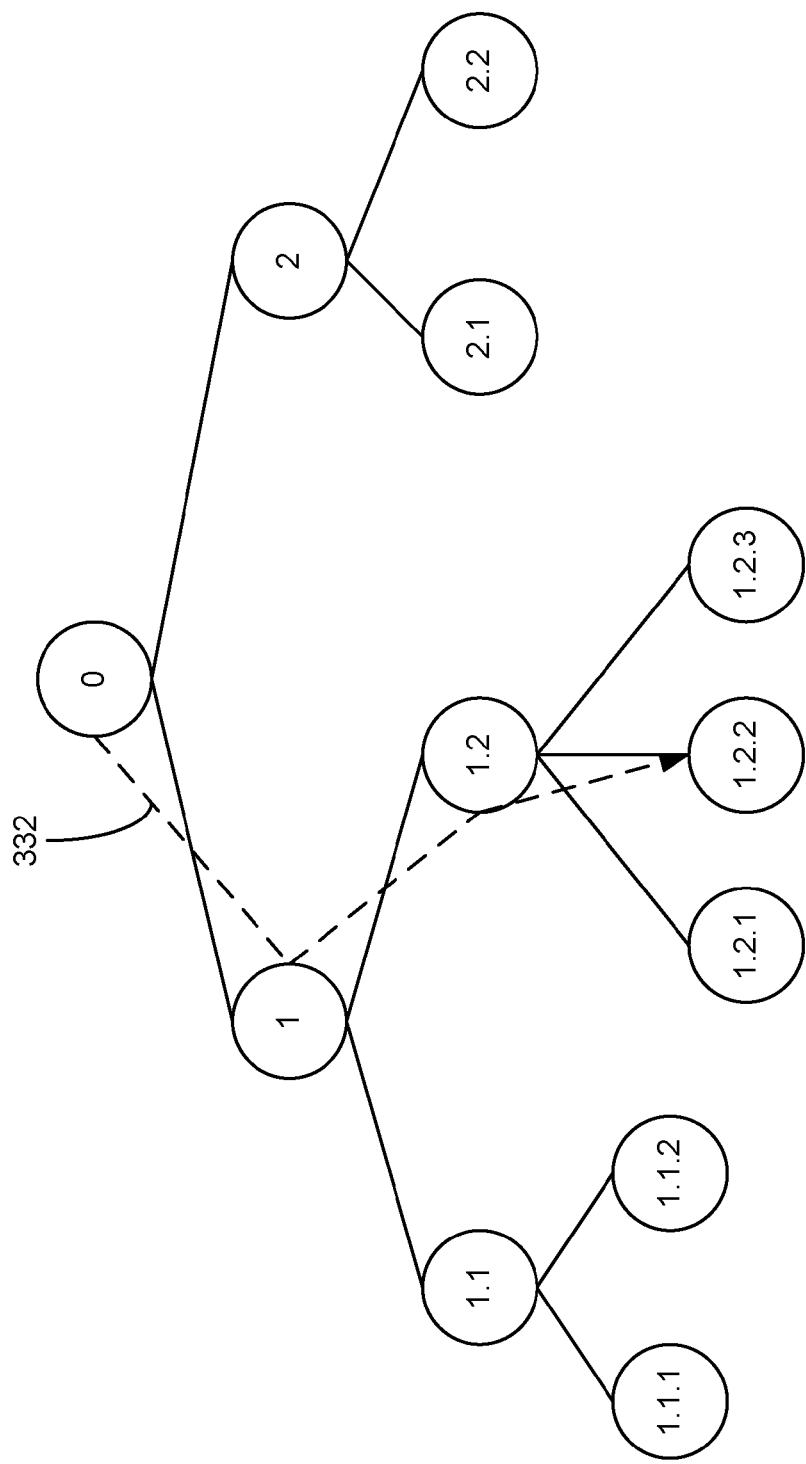
FIG. 6 shows a generic hierarchical node index.

FIGS. 6-11 will now be discussed with reference to FIGS. 1-5. FIG. 6 shows a representative hierarchical node index, or tree. The hierarchical node index is illustrated as a trie structure having a plurality of nodes. A trie structure or, prefix tree, is an ordered tree data structure that is used to store an ordered mapping of nodes that are generally represented as strings. Each path down the tree, such as the path 332, has a leaf, or terminating, node, such as node 1.2.2. Every leaf node represents, points to, or otherwise associates to, a unit of side information. In some implementations the other nodes in a path, such as nodes 0, 1 and 1.2, may also each be associated with a unit of side information. Each unit of side information contains compression state information.

There are a variety of ways in which a node can be associated with side information. In one embodiment, the node can contain a pointer to a block of memory with the side information. Alternatively, the node can contain the name of, or a pointer to, a file stored on a local disk, or a shared network resource, that contains the side information. In another embodiment, the node data structure itself could contain space for the side information data. In yet another embodiment, the node could store, or point to, previously encoded data, such as a webpage or email message, and could generate relevant side information on-the-fly.

In the generalized trie structure shown in FIG. 6, the root node 0 is shown as the top node. The root node 0 could, for example, represent the protocol or data type, such as HTTP or email messaging. The root node 0 defines the starting point for the tree, and for subsequent searches, or traversals, of the tree. Each node in the HNI can point to a unit of side information, including compression state information, related to that node, or only the terminating, or leaf nodes in each path can be associated with a side information unit. Branching off the root node is a second level of nodes, depicted as nodes 1 and 2. Nodes 1 and 2 represent data which is related to, and/or derived from, the root node. For instance, the second level of nodes may represent, depending on the data type associated with the particular hierarchical node index, two separate MIME types for email, or different HTML media types for an HTTP request. A third level, as shown by the nodes 1.1, 1.2, 2.1 and 2.2, is directly derived from, or related to, the nodes in the second level, namely nodes 1 and 2, and indirectly derived from, or related to, the root node 0. These third-level nodes could, for example, represent the first messages in email threads, or the domain names in URLs associated with different webpages. A fourth level of nodes, represented by nodes 1.1.1 and 1.1.2, are derived from third-level node 1.1, while nodes 1.2.1, 1.2.2 and 1.2.3 are derived from third-level node 1.2. These fourth-level nodes could be, for example, the next email messages in the email threads, or could be, the paths in the URLs. Each new compression of similar data can create new branches in the tree extending from previous nodes.

Figure 6A:
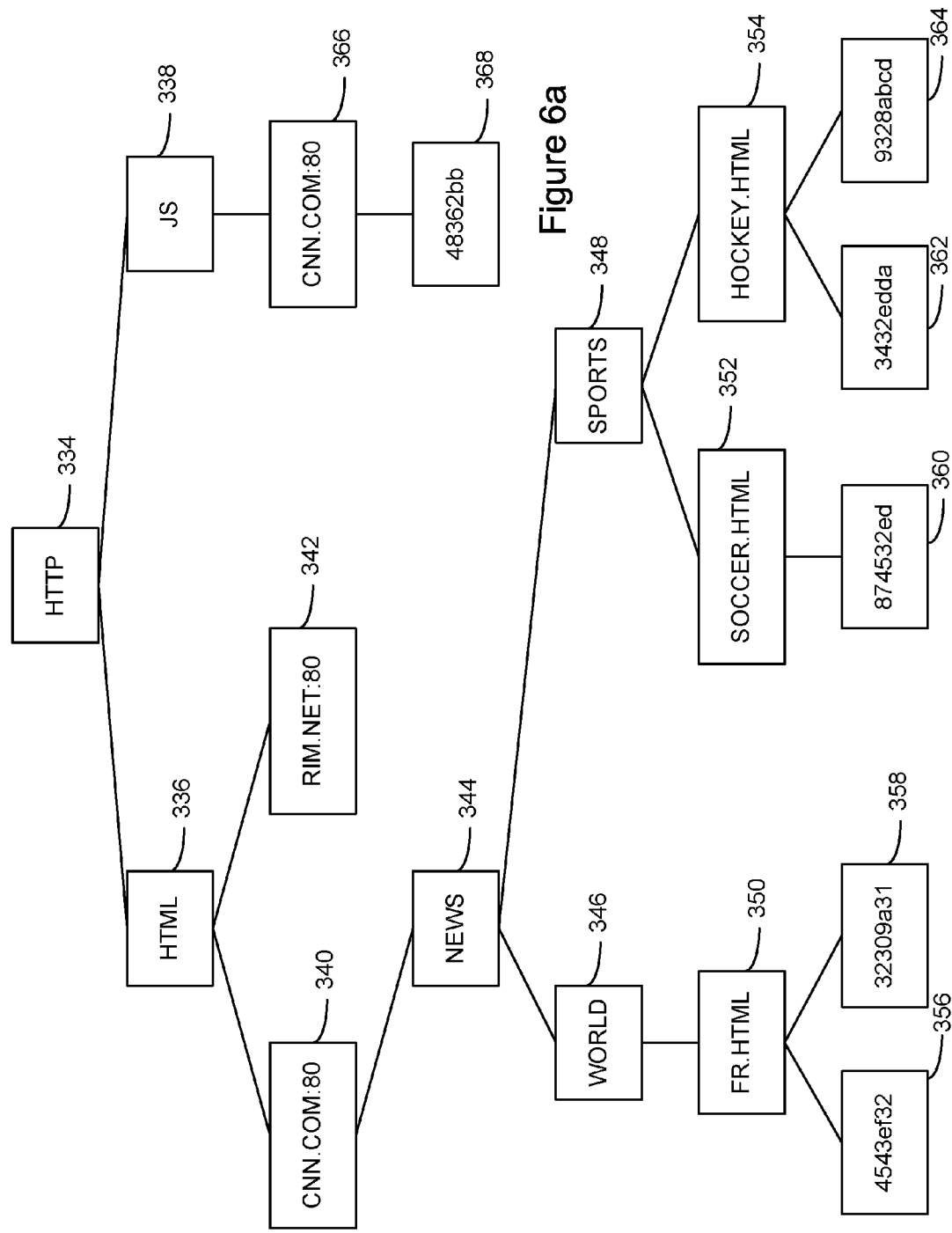
FIGS. 6*a* and 6*b* show hierarchical node indexes for HTTP and email messaging communications, respectively.
Figure 6B:
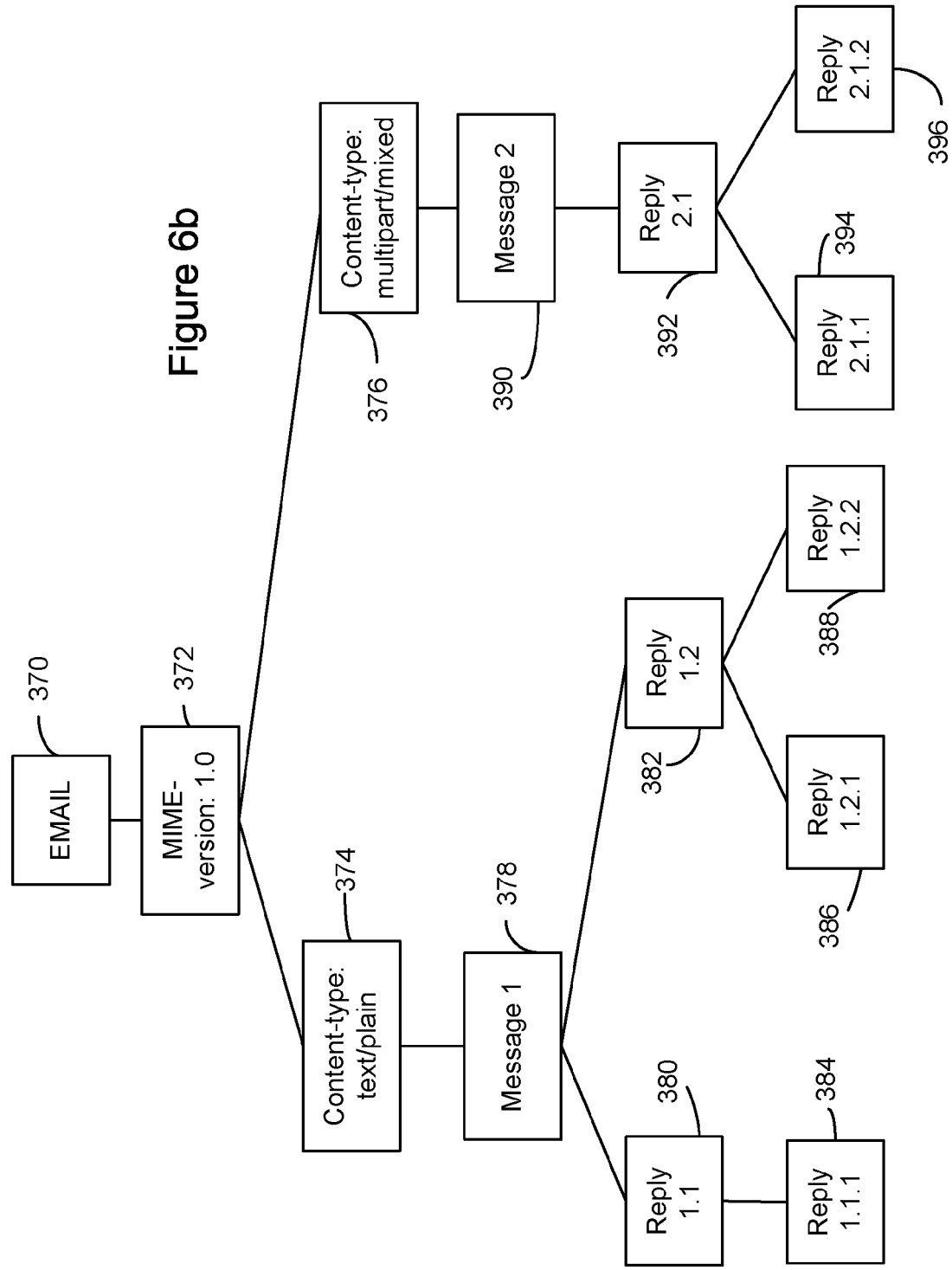

Exemplary HNIs are shown in FIGS. 6a and 6b, which show HNIs grown or developed from HTTP compression and email message compression, respectively. A HNI can be created for each type, or piece, of data previously encoded or decoded by the server and mobile device 100, respectively. For example, each of the server and mobile device 100 can create and maintain HNIs related to compression and decompression of HTTP webpages, and can create and maintain other HNIs related to compression and decompression of email messages. In FIG. 6a, the root node 334 indicates that the HNI maps compression of HTTP webpages. Two nodes 336 and 338 branch from the root node 334, and represent webpages created with Hypertext Markup Language (HTML) and JavaScript™ (JS), respectively. The third-level nodes 340, 342 and 366 contain the high level domain names CNN.COM:80, RIM.NET:80 and CNN.COM:80, respectively. The domain names are normalized to explicitly add the port numbers. This level could equally contain IP addresses or other network addresses.

Each node in the path from the root node 334 to respective leaf nodes represents constituent parts (e.g. protocol; domain name:port; path; and optionally query) of a Uniform Resource Locator (URL) for an accessed webpage, plus a unique identifier to uniquely identify the contents of the webpage associated with the URL at the time the page was accessed. The unique identifier is required to deal with constantly changing webpages associated with particular URLs.

Thus, the path traversing nodes 334, 336, 340, 344, 346, and 350 represents the URL HTTP://CNN.COM:80/NEWS/WORLD/FR.HTML. Leaf nodes 356 and 358 represent the contents of this URL at two different access times, as indicated by the different unique identifiers '4543ef32' and '32309a31', respectively, and point to side information created for the webpage at the respective times. The separate variants of a particular URL, indicated by leaf nodes 356 and 358 can be ordered by, for example, creation date and time. For example, newer variants of a URL can always be indexed, or added, to the "right" of older variants. Thus, in searching or traversing the HNI, the search algorithm can identify and access the side information associated with the newest variant of a given URL. The unique identifier can be any identifier that uniquely identifies the contents, such as a hash of the contents of the accessed page, at the time the side information is created. Hash schemes that can be used include CRC-32, MD5, and MD4, or any suitable hashing technique that provides a good hash distribution. If the particular hash technique implemented is not sufficient to guarantee uniqueness, the unique identifier can also include other information, such as the size of the side information, in bytes, associated with the accessed data.

Following the path through nodes 334, 336, 344, 348 and 352 leads to the leaf node 360, containing unique identifier '874532ed', for URL HTTP://CNN.COM:80/NEWS/SPORTS/SOCCER.HTML. Similarly, the path through nodes 334, 336, 344, 348 and 354 represents the URL HTTP://CNN.COM:80/NEWS/SPORTS/HOCKEY.HTML, and leads to two leaf nodes 362 and 364, indicated by unique identifiers '3432edda' and '9328abcd', respectively. The path through nodes 334, 366 and 368 represents a further URL for HTTP://CNN.COM:80 created under JS. The unique identifier '48362bb', shown at node 368, stores the location of the side information associated with the compression of this URL.

FIG. 6b shows a HNI created for email messages. In contrast to the HTTP example of FIG. 6a, in this example of an email HNI, side information can be associated with intermediate nodes, as well as leaf nodes. The root node 370 indicates that the HNI maps EMAIL side information related to email messages. The second-level node 372 indicates that the media type of the email messages, which in this case is MIME-version: 1.0. The third-level nodes 374 and 376 indicate the content-type of the messages, shown as text/plain and multipart/mixed, respectively. The path through nodes 370, 372, 374, 378, 380 and 384 depict a thread of email messages of MIME-version 1.0, context-type: text/plain, starting with a first message, Message 1, a reply to the first message, Reply 1.1, and a further reply, Reply 1.1.1. Each of nodes 378, 380 and 384 can contain side information, including state compression information related to compression of its respective message or reply. Four other paths are shown in FIG. 6b. These paths are composed of the nodes 370, 372, 374, 378, 382 and 386; nodes 370, 372, 374, 378, 382 and 388; nodes 370, 372, 390, 392 and 394; and nodes 370, 372, 390, 392 and 399, respectively, and depict separate email threads. Each of the message nodes 378, 382, 386, 388, 390, 392, 394 and 396 can have side information associated therewith. This side information can include state compression information derived from the compression of the respective messages and replies.

When dealing with YK compression or other grammar-based compression techniques, the side information includes grammar rules and/or frequency counts (compression state information) of previously compressed data. Use of compression state information from compression of related data can improve data compression of new related data, or future nodes. If both parties to a communication have access to compression state information related to previous data compressions, they can significantly improve compression and decompression efficiency through interactive compression.

Figure 7:
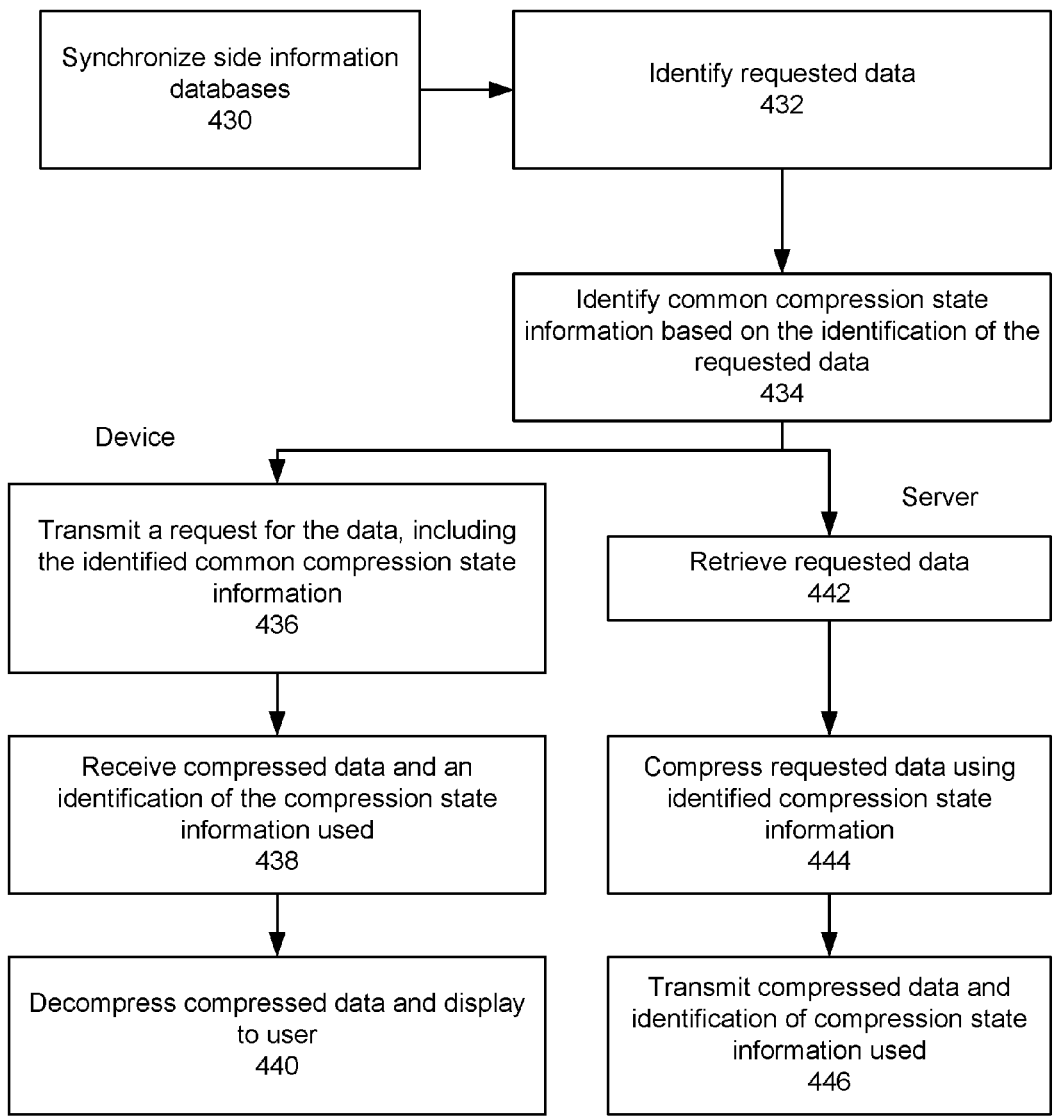
FIG. 7 is a flowchart outlining a method of communicating compression state information for interactive compression.

FIG. 7 is a flowchart of a method of interactive compression for communication between the server and mobile device 100. Side information, including compression state information, that has been previously stored as a result of previous related data compressions is retrieved. The determination, or identification, of the compression state information to use in the data compression can be effected by either the mobile device 100 or the server.

Once a relationship between the mobile communication device 100 and the server is established, such as by having the device 100 transmit a signal to the server indicating that the device is YK-enabled, and by having the server return a Device ID, the mobile device 100 and the server synchronize their respective side information databases 314 and 324 (step 430) in order to implement interactive compression and improve subsequent data compression. Synchronization of the side information databases 314 and 324 ensures that the mobile device 100 and the server are aware of, or share, common side information. Typically, the synchronization will involve a mapping or identification of common side information entries within each database. As used herein, 'common' denotes information known to both parties to a communication. The common information described herein can be pointers to, or other locators of, side information; the side information itself; and/or copies of the original data, such as webpage data or email messages, from which the side information can be derived. Common information can be stored in a central location accessible to both parties; or can be separately stored and maintained in parallel by the two communicating entities. Synchronization can occur only when the device 100 and the server initially establish communication, periodically, or when new information is added to either database. One embodiment of a method of synchronizing the databases is described with reference to FIG. 8, below.

Once the side information databases 314 and 324 are synchronized, an identification of the data being requested is determined (step 432). Based on the identification of the requested data, common side information, including compression state information, that is relevant or related to the requested data and known to both the server and mobile device 100 can then be determined (step 434). If the side information is represented or organized in a trie structure, the related common side information can be identified by traversing or searching the tree to determine common nodes based on the identification of the requested data, such as its URL or email message identifier. One method of determining common side information, including compression state information entry(ies), is described in relation to FIG. 9. The identification of the common side information can be performed at either the mobile device 100 or the server.

If the common side information identification is being effected at the mobile device 100 in step 434, the mobile device 100 transmits a request for the data to the server that includes an identification of common side information determined at step 434, including and identification of common compression state information (step 436). The device 100 then waits to receive the requested data, in a compressed format, from the server (step 438). The compressed data is accompanied by an identification, or other indication, as to the compression state information used in its compression. Using this compression state information, the device 100 can then decompress the data, through its decoder 103, and display, or otherwise provide the decompressed data, to the user (step 440).

If the server identifies the common side information at step 434, the MDS then retrieves the requested data (step 442). The requested data may be located within the server, or may be accessible through a remote server, such as HTTP server 275, over the network 200. After retrieving the data, the server compresses the requested data (step 444), through its encoder 277, using compression state information associated with at least one unit of common side information identified at step 434. The server then transmits the compressed data, together with an indication or identification of the compression state information used to compress the data (step 446).

Either the device 100 or the server can replace a unit of side information with a new unit of side information that is similarly related to the data.

In one embodiment, the replacement policy is age-dependent, i.e., side information that exceeds a predetermined age can be replaced by new side information similarly related to the data. For example, if a webpage was used, at one point in time, as the basis for creating compression state information to be used in later compressions, after a certain duration, the contents of the "same" webpage (the one with the same URL) may have changed, perhaps to the extent that the compression state information is now inappropriate for achieving a good compression ratio when compressing even the same webpage now and in the future. Therefore, the current contents of the same webpage can be used to create new side information to replace the old side information.

In another embodiment, the replacement policy is compression-dependent. If compression of the data with the appropriate side information available achieves at least a predetermined compression ratio, that side information can be retained. However, if the predetermined compression ratio is not achieved using that side information, new side information similarly related to the data can be created to replace the old side information.

In yet another embodiment, the replacement policy is to constantly update side information any time a document is compressed.

Figure 8:
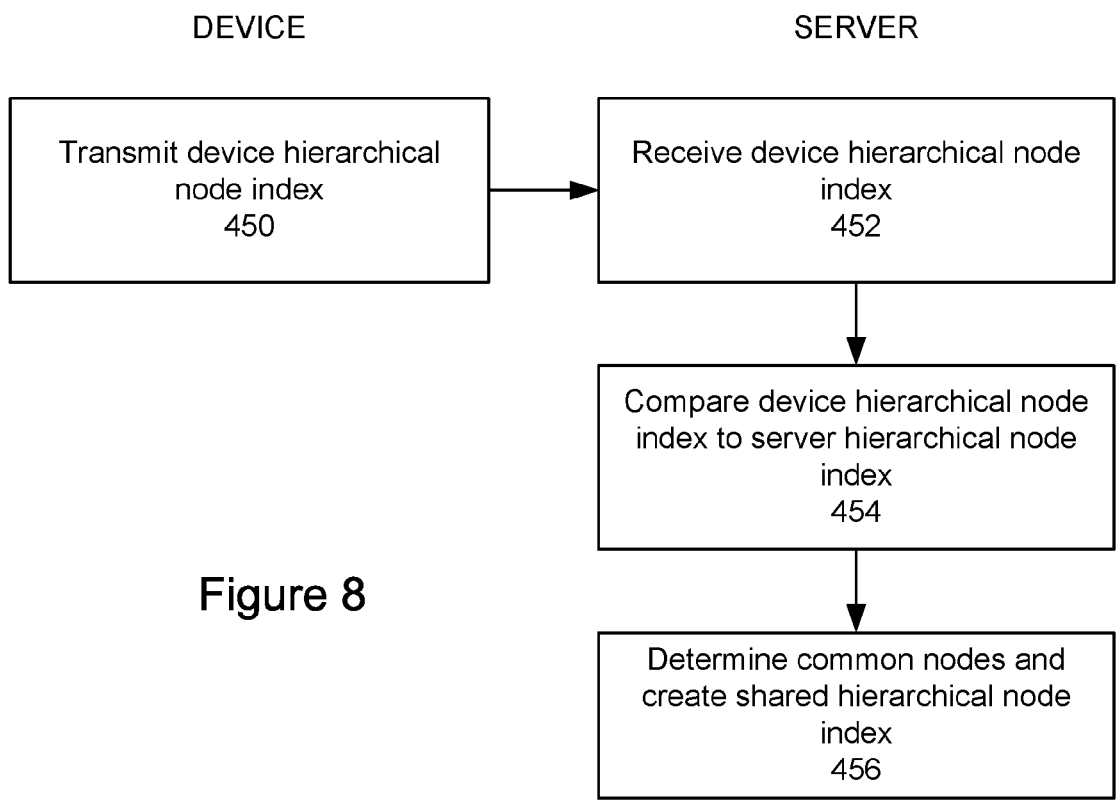
FIG. 8 is a flowchart outlining a method of synchronizing side information databases within a device and a server.

FIG. 8 depicts an exemplary method of synchronizing the side information databases 314 and 324. After the communication between the device 100 and the server is established, the device 100 can transmit a device hierarchical node index (such as the one shown in FIG. 6), or portion thereof, to the server (step 450). The device hierarchical node index (HNI) includes a number of nodes, at least some of which index, point to, or contain side information related to data which has been previously compressed by the server and transmitted to the device 100. The server receives the device HNI (step 452) and compares it to the server HNI (step 454). The server then determines nodes shared, or in common, between the device HNI and the server HNI, and creates a shared HNI that includes the nodes common to the device 100 and the server (step 456). The shared HNI can be determined in many manners. In one embodiment, the shared HNI can be created by comparing all of the nodes in the respective HNIs, determining all of the nodes common to both node indexes and creating a shared hierarchical node index based on the common nodes. Alternatively, the shared HNI can be created by determining all of the nodes which are in one HNI and not in the other. This shared HNI can be provided to the device 100, if the device 100 is to identify common side information, as described above. After determining the shared HNI, the device and/or server HNI can be updated to reflect the differences between the device and the server HNIs. For instance, once the shared HNI is determined, the nodes in the device HNI which are not listed in the shared HNI can be deleted from the device HNI. In another embodiment, the server can request the indexes for the non-common nodes from the device 100 and update the server HNI and the shared HNI accordingly.

A copy of the shared HNI can be stored in a database, such as the side information databases within the device and the server. Alternatively, the shared HNI can be stored in a central repository, whereby the device and the server may access the shared node index to update when required. If the device 100 and the server have previously communicated and exchanged side information database information, the complete hierarchical node index need not again be shared between the device 100 and the server to effect synchronization in subsequent communication sessions. For example, if the server recognizes the Device ID sent by the device 100 at the time of establishing a communication session, the device 100 can merely send side information created since its last interaction with the server.

Synchronization typically occurs each time the device is initially connected to the server, and can occur periodically as communications continue between the server and the device 100. Ongoing synchronization can also be effected in order to maintain the shared HNI on the server, or to maintain shared HNIs on both the server and the device 100. The individual device and server HNIs will be updated as communication between the device 100 and the server continue. In order to maintain the shared HNI, the shared HNI can also be periodically or continuously updated. This updating can be performed by synchronizing the HNIs at predetermined intervals. Maintaining the synchronization between the device and the server can also be effected by both the device and the server providing their rules for the addition or removal of nodes to the other communicating party. In this manner, an update on one of the side information databases is reflected on the other, since they know each other's management rules. Corresponding updates to the shared HNI can also be performed. Alternatively, every new node that is added to either HNI can be immediately transmitted to the other.

Figure 9:
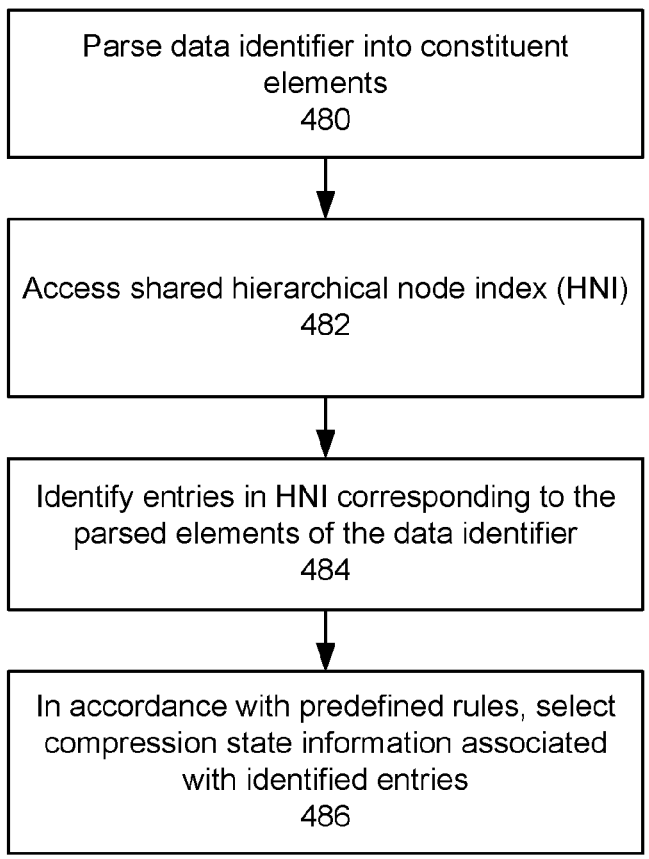
FIG. 9 is a flowchart outlining a method of determining compression state information.

FIG. 9 shows a method of determining common side information, and its associated compression state information, to be used for the compression of requested data. Once the data to be requested is identified, such as by its URL or email thread, the data identifier is parsed into its respective elements, such as its constituent protocol, domain name, path, etc., as described above in relation to the HTTP HNI depicted in FIG. 6a (step 480). Depending on whether the device or the server is determining the shared compression state information (see e.g. description of FIG. 7), the appropriate HNI is accessed (step 482). The HNI is then searched to identify relevant entries within the HNI containing side information related to the requested data (step 484). In one embodiment, this is performed by comparing the parsed data identifier elements to the nodes in the HNI. In accordance with predetermined rules, side information, including compression state information, can then be selected (step 486).

The manner in which side information is selected will now be described with reference to the exemplary HNI depicted in FIG. 6a. Clearly, if the search or traversal of the HNI reveals all the constituent parts of a identifier associated with the requested data in a single path (i.e. an exact hit for a particular URL), such as HTTP://CNN.COM:80/NEWS/WORLD/FR.HTML, the predetermined rules can be set to choose the side information associated with all of the leaf nodes, such as leaf nodes 356 and 358, associated with the URL, or with some, or one, of the leaf nodes, such as leaf node 358. For example, in an embodiment, the rule could be set to choose the side information associated with the most recent leaf node. Generally, when the data is HTTP data, the side information, and its associated compression state information, that is 'closest' to the lowest common node, and is a leaf node (i.e., has no child nodes), is selected. As will be understood, it is only necessary to choose leaf nodes when the requested data is webpage, or other data in which a partial path may not point to actual data. In implementations in which intermediate nodes can contain or identify side information, and associated compression state information, such as in the HNIs representing email threads in FIG. 6b, non-leaf nodes can also be selected.

Where all the constituent parts are not found in the HNI in a single path (i.e. where there is no exact hit in the traversal of the tree), rules based on the 'closeness' of the nodes within the HNI can be used. Depending on the desired implementation, and type of data being compressed, 'closeness' can, for example, be based on minimum number of matched elements or common nodes, or on a maximum number of unmatched elements. 'Common nodes' are nodes within a single path that are identical in content and order to the parsed parts of the identifier being searched. For example nodes 340 (CNN.COM:80), 366 (HTML) and 334 (HTTP) are common nodes to nodes 344, 346, 348, 350, 352 and 354. However, node 366, which indicates the same domain name (CNN.COM:80) is not a common node to any of nodes 344, 346, 348, 350, 352 and 354.

In the following examples the identifier of the requested data is HTTP://CNN.COM:80/NEWS/WORLD/CANADA.HTML and the shared HNI is as shown in FIG. 6a. In a first embodiment, the definition of closeness specifies a minimum distance between the root node and the closest common ancestor between two nodes (i.e. the minimum number of matched nodes or elements). For example, by traversing the tree from the root to a first non-identical node, it can be seen that the requested data identifier and nodes 348 (HOCKEY.HTML) and 352 (SOCCER.HTML) share node 344 (NEWS) as their closest, or least distant, common ancestor node (other common ancestor nodes are nodes 340, 336, and 334). Node 344 is four nodes down from the root of the tree (i.e. has a 'root closeness' of '4'). If a closeness rule in an application specifies a minimum root closeness of '1', '2', '3', or '4' then the side information associated with the leaf node 360 depending from node 352, or leaf nodes 362 and 364 depending from node 354, could be used as side information for compression of the requested data. If the specified root closeness of the closest common ancestor node is '5', the side information associated with nodes 352 and 354 could not be used. However, the side information associated with the leaf nodes 356 and 358 depending from node 350 (FR.HTML) could be used, since requested data and the path from the root node 334 to node 350 have a common ancestor node 346 that has a root closeness of '5'. The selection of the required number of matched elements is a matter of choice, and will depend on the application, protocol and data type.

In a second embodiment, closeness is defined as the maximum number of unmatched elements between the constituent parts of the requested data identifier, and paths within the tree. If we are again looking for side information to use in the compression of HTTP://CNN.COM:80/NEWS/WORLD/CANADA.HTML, and the maximum number of unmatched elements is specified as '1', then only the side information associated with node 350 (FR.HTML) could be used. If the maximum number of unmatched elements were increased to '2', the side information associated with nodes 350, 352 and 354 could all be used. Again, the maximum number of unmatched elements is a matter of choice and design.

Where the requested data, such as a webpage, includes different types of compressible information (e.g. text and video), improved compression can be achieved by using different compression state information for each type of information. In such cases, multiple units of side information may need to be identified. Multiple units of side information, and their associated compression state information, can also be selected as being relevant to a current data request according to predetermined rules. It is also possible to implement rules to identify multiple related units of side information as described above, and to choose among them, or to compress the data according to each identified unit and select the unit of side information giving the best compression ratio. A combination of these methods can also be used, whereby each node is given a particular relative strength according to its age and level within the hierarchy, and only the side information from those nodes with the highest combined rating is used.

Figure 10:
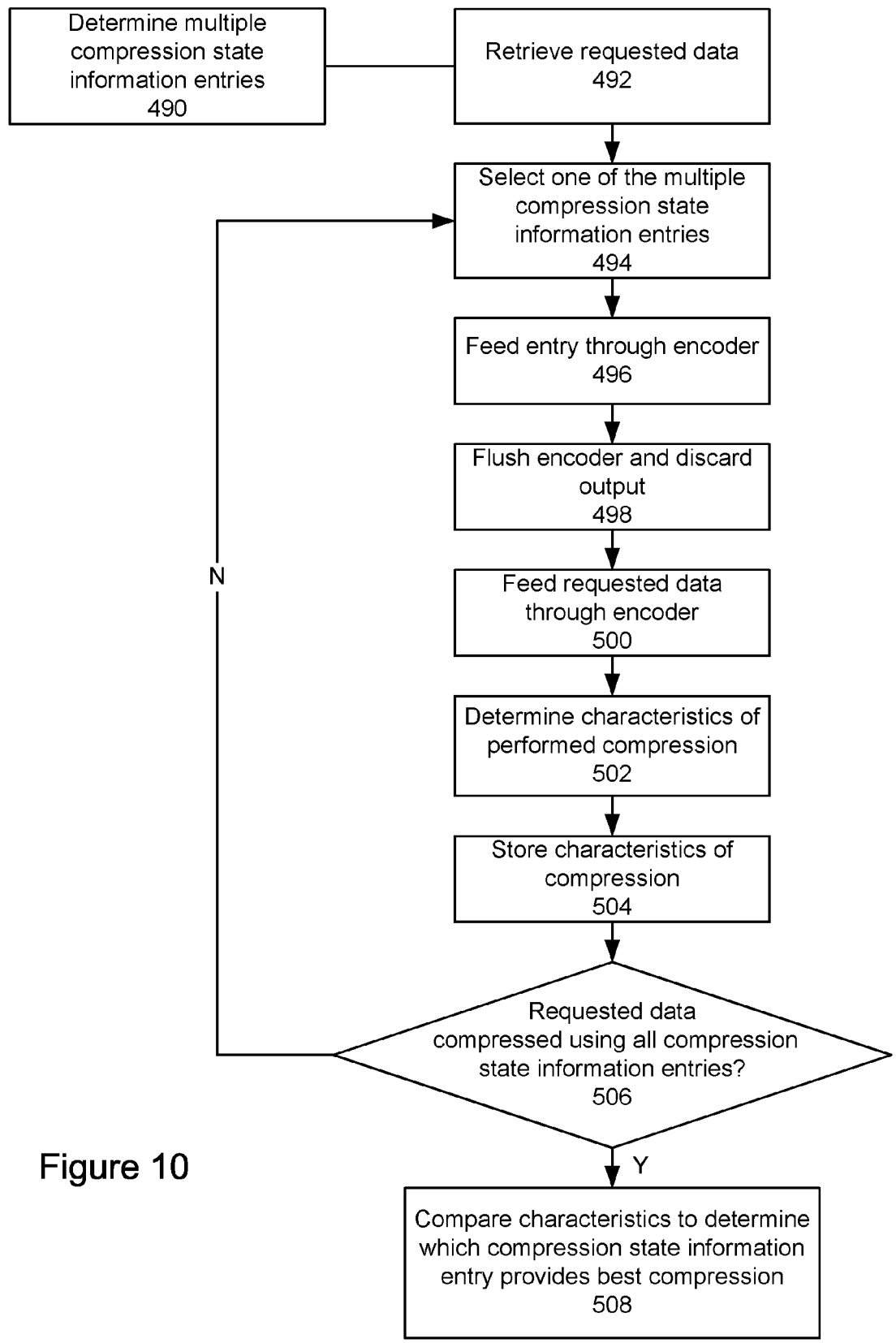
FIG. 10 is a flowchart outlining a method of interactive compression using multiple compression state information entries.

FIG. 10 shows a method of compressing data when multiple units of side information, associated with multiple compression state information entries, are identified. After the multiple compression state entries are identified (step 490), the requested data is then retrieved by the server (step 492). One of the multiple compression state entries is then selected (step 494) and then fed through the encoder (step 496), preferably a YK encoder. The encoder is then flushed, to clear its cache, and the output from the compression of the compression state entry is discarded (step 498). The requested data is then fed through the encoder (step 500), which compresses the requested data using the parameters of the compression state entry. The characteristics of the compression, such as the compression ratio, are then determined (step 502). This information can then be stored in a database or kept in memory (step 504). A check is then performed to determined if the requested data has been compressed using all of the identified compression state information entries (step 506). If not, another identified compression state information entry is selected (step 494) and steps 496 to 504 repeated for the newly selected compression state information entry. After the requested data has been compressed using all of the compression state information entries, the characteristics of all of the compressions are compared and the compression state information entry providing the best compression, such as the best compression ratio, is determined.

Figure 11:
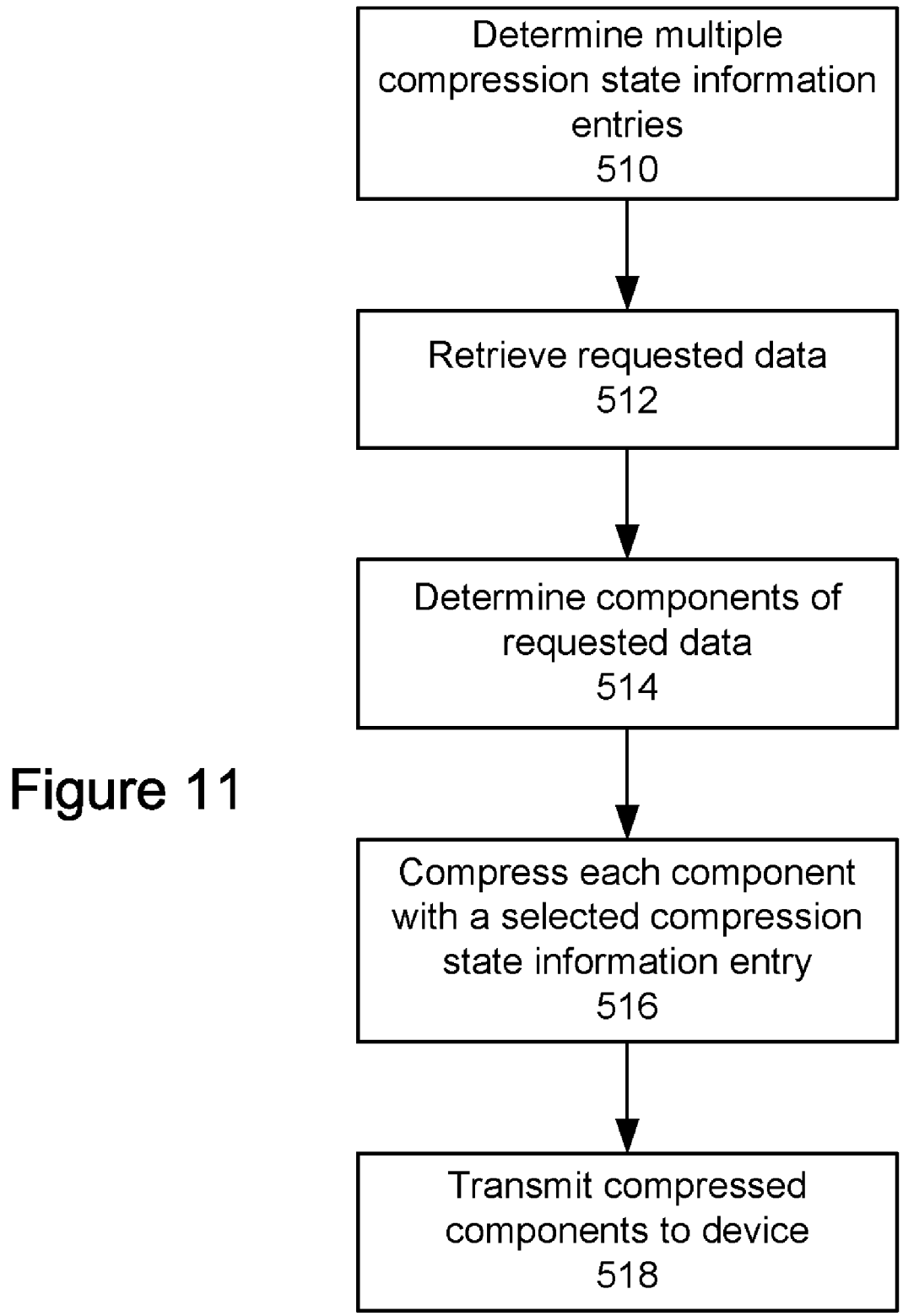
FIG. 11 is a flowchart outlining a method of the interactive compression of multi-part requested data.

FIG. 11 shows a method of compressing data, such as a webpage, containing multiple data types. After determining the multiple compression state information entries (step 510) for use in the data compression, the requested data is then retrieved by the server (step 512). In this example, the requested data is assumed to contain separately identifiable components associated with each data type. The separate components can be individually identified and parsed by the server to determine their constituent elements (step 514). Separate units of side information can then be identified, as described above, for each component (step 515), and each component can then be compressed by the server using the compression state entry identified for that component (step 516). Alternatively, as described in FIG. 10, each component may be compressed using multiple compression state information entries. The compressed data is then transmitted to the device (step 518). In one embodiment, the compressed components are combined to form a single data stream before being transmitted to the device. This data stream can include a header indicating the compression state entries used to compress each component, so that the device 100 can decompress the data stream. Alternatively, the components can be individually transmitted to the device with headers indicating the relationship between the individual components. The header preferably includes an indication or identification, of the compression state information used.

In the above description, for purposes of explanation, numerous details have been set forth in order to provide a thorough understanding of the present invention. However, it will be apparent to one skilled in the art that these specific details are not required in order to practice the present invention. In other instances, well-known electrical structures and circuits are shown in block diagram form in order not to obscure the present invention. For example, specific details are not provided as to whether the embodiments of the invention described herein are implemented as a software routine, hardware circuit, firmware, or a combination thereof.

Embodiments of the invention may be represented as a software product stored in a machine-readable medium (also referred to as a computer-readable medium, a processor-readable medium, or a computer usable medium having a computer readable program code embodied therein). The machine-readable medium may be any suitable tangible medium, including magnetic, optical, or electrical storage medium including a diskette, compact disk read only memory (CD-ROM), memory device (volatile or non-volatile), or similar storage mechanism. The machine-readable medium may contain various sets of instructions, code sequences, configuration information, or other data, which, when executed, cause a processor to perform steps in a method according to an embodiment of the invention. Those of ordinary skill in the art will appreciate that other instructions and operations necessary to implement the described invention may also be stored on the machine-readable medium. Software running from the machine readable medium may interface with circuitry to perform the described tasks.

The above-described embodiments of the present invention are intended to be examples only. Alterations, modifications and variations may be effected to the particular embodiments by those of skill in the art without departing from the scope of the invention, which is defined solely by the claims appended hereto.

What is claimed is:

1. A method of interactive compression, comprising:

identifying, for use in compressing data, at least two compression state information entries shared between parties to a communication, each of the at least two compression state entries including compression state information, the compression state information including parameters of one or more previously completed compressions of the nearest related previously compressed data for use in interactively compressing the data;

compressing the data with each of the at least two compression state information entries;

determining, among the at least two compression state information entries, a preferred compression state information entry that provides a greatest compression ratio; and transmitting the data, compressed in accordance with the preferred compression state information entry, from one of the communicating parties to the other of the communicating parties.

2. The method of claim 1, further comprising transmitting an identification of the preferred compression state information entry to the other of the communicating parties.

3. The method of claim 1, further comprising receiving the at least two compression state information entries from the other of the communicating parties.

4. The method of claim 1, wherein identifying the at least two compression state information entries comprises selecting the most recently used compression state information entries.

5. The method of claim 1, wherein identifying the at least two compression state information entries comprises:
   searching a shared hierarchical node index; and
   selecting at least two compression state information entries that comply with a predetermined set of rules for determining compression state information entries.

6. A method of requesting data from a communicating party, the method comprising:
   identifying at least two compression state information entries, associated with the data and shared with the communicating party, for use in compressing the data, each of the at least two compression state entries including compression state information, the compression state information including parameters of one or more previously completed compressions of the nearest related previously compressed data for use in interactively compressing the data;
   transmitting a data request, the data request including an identification of the at least two compression state information entries; and
   receiving the data, in a compressed format, with an identification of the one of the shared at least two compression state information entries used to compress the data.

7. The method of claim 6, further comprising decoding the one of the at least two compression state information entries compressed data using the identified shared compression state information entry.

8. The method of claim 6, wherein the step of identifying comprises traversing a shared hierarchical node index to identify common elements known to both communicating parties.

9. The method of claim 8, wherein the hierarchical node index is stored in a mobile communications device.

10. The method of claim 8, wherein the hierarchical node index is stored in a server.

11. The method of claim 8, wherein the hierarchical node index is stored in a common shared resource accessible to a mobile communications device and to a server.

12. The method of claim 8, wherein the common identified elements are represented as nodes in the hierarchical node index.

13. A mobile communication device for use in interactive compression, comprising:
   a side information database storing at least two compression state information entries shared between the mobile communication device and a server, each of the at least two compression state entries including compression state information, the compression state information including parameters of one or more previously completed compressions of the nearest related previously compressed data for use in interactively compressing the data;
   an encoder to compress the data with each of the at least two compression state information entries; and
   a processor to determine, from among the at least two compression state information entries, a preferred compression state information entry that provides a greatest compression ratio, and to transmit the data, compressed in accordance with the preferred compression state information entry, to the server.

14. The mobile communication device of claim 13, wherein the side information database stores the at least two compression state information entries in a hierarchical node index.

15. The mobile communication device of claim 13, further comprising a decoder to decompress compressed data received from the server in accordance with a compression state information entry identified by the server as a preferred compression state information entry.

16. A server for use in interactive compression, comprising:
   a side information database storing at least two compression state information entries shared between a mobile communication device and the server, each of the at least two compression state entries including compression state information, the compression state information including parameters of one or more previously completed compressions of the nearest related previously compressed data for use in interactively compressing the data;
   an encoder to compress the data with each of the at least two compression state information entries; and
   a processor to determine, from among the at least two compression state information entries, a preferred compression state information entry providing a greatest compression ratio, and to transmit the data, compressed in accordance with the preferred compression state information entry, to the mobile communication device.

17. The server of claim 16, wherein the side information database stores the at least two compression state information entries in a hierarchical node index.

18. The server of claim 16, further comprising a decoder to decompress compressed data received from the mobile communication device in accordance with a compression state information entry identified by the mobile communication device as a preferred compression state information entry.

19. The server of claim 16, wherein the compression state information comprises at least one of grammar rules and frequency counts.

20. The method of claim 1, wherein the compression state information comprises at least one of grammar rules and frequency counts.

21. The method of claim 6, wherein the compression state information comprises at least one of grammar rules and frequency counts.

22. The mobile communication device of claim 13, wherein the compression state information comprises at least one of grammar rules and frequency counts.

* * * * *